United States Patent
Taguchi et al.

(10) Patent No.: US 7,068,338 B2
(45) Date of Patent: Jun. 27, 2006

(54) ELECTRO-OPTICAL DEVICE SUBSTRATE, ELECTRO-OPTICAL DEVICE, AND ELECTRONIC APPARATUS

(75) Inventors: Satoshi Taguchi, Matsumoto (JP); Yuichiro Miyako, Chino (JP); Hideki Kaneko, Shiojiri (JP)

(73) Assignee: Seiko Epson Corporation (JP)

( * ) Notice: Subject to any disclaimer, the term of this patent is extended or adjusted under 35 U.S.C. 154(b) by 86 days.

(21) Appl. No.: 10/764,607

(22) Filed: Jan. 23, 2004

(65) Prior Publication Data

US 2004/0189915 A1    Sep. 30, 2004

(30) Foreign Application Priority Data

Jan. 23, 2003   (JP)   ............................. 2003-014733
Nov. 6, 2003    (JP)   ............................. 2003-377171

(51) Int. Cl.
  *G02F 1/136*   (2006.01)
  *G02F 1/1343*  (2006.01)
  *G02F 1/1345*  (2006.01)

(52) U.S. Cl. ........................ 349/149; 349/139; 349/42; 349/151; 349/152; 345/104

(58) Field of Classification Search ................ 349/139, 349/149, 151, 152; 345/104
See application file for complete search history.

(56) References Cited

U.S. PATENT DOCUMENTS

| | | | |
|---|---|---|---|
| 5,757,450 A | | 5/1998 | Fujii et al. |
| 5,914,763 A | | 6/1999 | Fujii et al. .................... 349/149 |
| 6,327,443 B1 | * | 12/2001 | Sekiguchi ...................... 399/42 |
| 6,888,606 B1 | * | 5/2005 | Hinata et al. ................ 349/149 |
| 6,917,408 B1 | * | 7/2005 | Nishino ....................... 349/149 |

FOREIGN PATENT DOCUMENTS

| | | |
|---|---|---|
| JP | 11-007039 | 1/1999 |
| JP | 2000-056699 | 2/2000 |
| JP | 2002-040475 | 2/2002 |
| JP | 2002-148654 | 5/2002 |
| JP | 2002-229009 | 8/2002 |
| JP | 2002-350892 | 12/2002 |
| KR | 1996-11489 | 4/1996 |

OTHER PUBLICATIONS

Korean examination report dated Oct. 31, 2005.

* cited by examiner

*Primary Examiner*—Huyen Ngo
(74) *Attorney, Agent, or Firm*—Harness, Dickey & Pierce, P.L.C.

(57) ABSTRACT

An electro-optical device substrate is provided comprising a base, and a plurality of wirings formed on the base. In at least one of the wirings, there is, in a bent portion of the wirings, a portion whose line width W0 gradually increases from a first side of the base to a second side. By preparing a portion having a large line width lowers the wiring resistance of the wirings, thereby preventing crosstalk from being generated in a display region of the electro-optical device.

18 Claims, 19 Drawing Sheets

ELECTRO-OPTICAL DEVICE SUBSTRATE, ELECTRO-OPTICAL DEVICE, AND ELECTRONIC APPARATUS

RELATED APPLICATIONS

The present application claims priority to Japanese Patent Application Nos. 2003-014733 filed Jan. 23, 2003 and 2003-377171 filed Nov. 6, 2003 which are expressly incorporated by reference in their entireties.

BACKGROUND OF THE INVENTION

1. Technical Field

The present invention relates to an electro-optical device substrate used in an electro-optical device, such as a liquid crystal device, an EL device or the like, an electro-optical device using the electro-optical device substrate, and an electronic apparatus using the electro-optical device.

2. Related Art

Presently, in various electronic apparatuses such as a cellular phone, a portable information terminal or the like, an electro-optical device such as a liquid crystal device, an EL device or the like is commonly used. For example, the electro-optical device is used as a display for visually displaying many pieces of information on the electronic apparatus. In this electro-optical device, a device using a liquid crystal as an electro-optical material, in other words, a liquid crystal device is known. In addition, an EL (Electro Luminescence) device using an EL as an electro-optical material is also known.

The liquid crystal device typically has a structure in which a liquid crystal layer is sandwiched between a pair of substrates having respective electrodes. Alignment of liquid crystal molecules in the liquid crystal layer is controlled per a display dot by supplying light to the liquid crystal layer and at the same time, controlling a voltage applied to the liquid crystal layer per the display dot. The light supplied to the liquid crystal layer is modulated depending on alignment states of the liquid crystal molecules, and an image such as a character, a number, a figure or the like is externally displayed according to whether or not the modulated polarized light passes through a polarizer.

In this liquid crystal device, a plurality of wirings is formed on one or both of the pair of substrates to transmit a signal to each of the electrodes. As of the present time, resolution in the number of segment electrodes × the number of common electrodes of about 180×220 is adopted. In this case, it is necessary to dispose wirings of the number corresponding to the number of electrodes on the substrate.

The liquid crystal device typically includes a display region being a region in which an image such as a character or the like is displayed, and another region, a so-called frame region that is formed around the display region and does not contribute to the display. There are many cases where the plurality of wirings is typically disposed in the frame region.

In the liquid crystal device, it is a recent general trend to minimize the frame region that does not contribute to the display. That is, it is general trend to make the frame narrow. In this case, the wiring width and the wiring gap should be small with respect to a plurality of wirings that can be put in the frame region.

In addition, recently, there is an increasing demand for high-resolution displays. To realize this, a plurality of wirings having a small line width should be formed on the substrate. For example, in the case of realizing a segment electrode×common electrode=240×320 QVGA type display, it is necessary to form a plurality of wirings having, for example, a wiring width of 3 μm, a space interval between the wirings of about 3 μm, in other words, a pitch of about 3+3=6 μm dimension.

However, since reducing the wiring width and the wiring gap depending on a narrow wiring space and an increased wiring number as described above increases the wiring resistance, crosstalk is generated, thereby scattering the display image.

The present invention is conceived to solve the aforementioned problems, and it is an object of the present invention to reduce the resistance of each of a plurality of wirings formed on a substrate.

SUMMARY

In order to achieve the above-stated object, an electro-optical device substrate according to the present invention is characterized in that it comprises a base and a plurality of wirings formed on the base, wherein at least one of the wirings has a portion whose width gradually increases from a first side of the base to a second side thereof.

According to this substrate, it is possible to make wiring resistance small by increasing the line width of the wirings. In addition, all line width of the wirings is not large, but a portion becomes large. In addition, since it gradually increases, it is not necessary to increase a region where a plurality of wirings should be formed. Thus, it satisfies a narrow frame.

In the configured electro-optical device substrate, it is preferable that the line width of at least one of the wirings increases continuously and gradually. In order to make the line width of the wire large, methods of increasing the line width gradually and increasing it step by step are used. To make wiring resistance between respective wirings uniform, the method of increasing the line width continuously is preferable to a method of increasing it step by step.

In the configured electro-optical device substrate, it is preferable that the plurality of wirings has a wide wiring width at the wiring that is extended the longest. Typically, the wirings tend to increase in wiring resistance as a length thereof increases. However, making the wiring width large at the wire line that is extended the farthest as described above can lower a resistance of the wiring has the longest length.

In the configured electro-optical device substrate, the plurality of wirings can be formed to have a bent portion, respectively. In this case, it is preferable that the bent portion has a large wiring width. Thus, increasing the line width along the bent portion of the wirings allows a total region of individual wirings to be widened without substantially widening a region on the substrate where a plurality of wirings should be formed. In addition, it is preferable that the bent portion of the wiring to be used be substantially at a 90° angle of.

In the configured electro-optical device substrate, it is preferable that gaps among the plurality of wirings be substantially uniform over all of the wirings. By doing so, it is possible to not only prevent generation of crosstalk certainly, but also increase the line width of each of the wirings as wide as possible.

In the configuration, it is preferable that the plurality of wirings be extended wirings for transmitting signals to electrodes. These kinds of extended wirings are typically longer in length, and in turn the wiring resistance tends to be larger. Accordingly, applying the present invention to the wirings is very effective to lower the wiring resistance.

In the configured the electro-optical device substrate, it is preferable that the plurality of wirings have a conductive pad, and the conductive pad be conducted to electrodes on another substrate by a conductive material. Thus, the wirings connected to other electrical elements by the conductive material tend to increase in wiring resistance.

Accordingly, applying the present invention to these wirings is very effective to lower the wiring resistance.

In the configured electro-optical device substrate, it is preferable that the wirings be formed of Cr, Cr/Ta, or ITO/Cr/Ta. Here, Cr/Ta has a structure in which Cr of the second layer is laminated on Ta of the first layer. In addition, ITO/Cr/Ta has a structure in which Cr of the second layer is laminated on Ta of the first layer, and the ITO of the third layer is laminated on Cr of the second layer.

A material such as Cr, Ta, ITO or the like is a material that forms a two-terminal device and is conventionally used as a conductive material. Applying the present invention to the wirings formed of these materials lowers wiring resistance without an increase in processing.

The electro-optical device according to the present invention is characterized in that it comprises an electro-optical device substrate having the configuration as described above, and an electro-optical material layer disposed on the electro-optical device substrate. For an electro-optical device substrate used in the electro-optical device, because the wiring resistance of a plurality of wirings disposed thereon is small, it is possible to not only form a narrow frame region but also obtain a clear display having no crosstalk in the case of increasing a display capacity by increasing the number of wirings.

In the constructed electro-optical device, it is preferable that one side of the electro-optical device substrate be a side to which the wiring substrate is connected, and the plurality of wirings be disposed in respective regions near edges of two sides adjacent to the one side, and at the same time, be extended along edges of the respective sides. In the case of this construction, the wiring resistance tends to increases since the wiring is lengthwise disposed along the two sides. Accordingly, applying the present invention to the electro-optical device of this construction is very effective to lower the wiring resistance.

The configured electro-optical device may have a counter substrate opposing the electro-optical device substrate, and the wirings may be connected to an electrode disposed on the counter substrate by a conductive material. Since the configured wirings tend to extend for a long length in the electro-optical device, the wiring resistance tends to be large. Thus, applying the present invention to the thus configured electro-optical device is very effective to lower the wiring resistance.

In the above-stated electro-optical device having a counter substrate, it is preferable that the electro-optical material be liquid crystal. The electro-optical device is a so called liquid crystal device. Applying the present invention to this liquid crystal device maintains small wiring resistance of the wiring to an electrode for applying an electric field to the liquid crystal layer, thereby obtaining good display with no crosstalk.

An electronic apparatus according to the present invention is characterized by having the above-configured electro-optical device, and a control means for controlling the operation of the electro-optical device. Although the electro-optical device included in this electronic apparatus has a narrow frame region, clear display can be obtained with no crosstalk. It allows a small space where the electro-optical device should be disposed, and also allows information on the electronic apparatus to be displayed clearly.

In addition, in the electro-optical device substrate according to the present invention, it is preferable that the longer a length in the plurality of wirings from the first side to the second side, the larger a wiring width of the entire region. By doing so, wiring resistance of respective wirings is reduced and also resistance between respective wirings becomes uniform.

Therefore, when the electro-optical device is manufactured using the electro-optical device substrate, an irregularity in display on the electro-optical device can be reduced.

In addition, in the electro-optical device according to the present invention, a counter substrate can be prepared opposing the electro-optical device substrate, and in turn, a plurality of electrodes and electrode wirings connected to the electrodes can be prepared in the counter substrate. The plurality of electrode wirings is connected to the respective plurality of wirings on the electro-optical device substrate by the respective conductive materials. In the configured electro-optical device, it is preferable that the width of each of the plurality of electrode wirings become large as a length of the corresponding wiring on the electro-optical device substrate is larger. By doing so, the wiring resistance of the wiring connected to each electrode on the counter substrate can be made uniform.

In the configured electro-optical device, it is preferable that the width of the electrode wirings on the counter substrate corresponding to a relatively short wiring or wirings out of the plurality of wirings on the electro-optical device is small, as compared to one corresponding to the relatively long wiring. In the case where a length of the wiring on the electro-optical device is short, the wiring resistance of the wiring is lowered. Accordingly, the wiring resistances are unbalanced among wirings having a long length, which causes an irregularity in the display. In preventing this, there is a limitation to thin the wiring width while thinning a wiring width of the wirings having a short length and to increase the wiring resistance. By thinning the width of the electrode wirings on the counter substrate, it is possible to obtain uniform wiring resistance among a plurality of wirings prepared over both the electro-optical device substrate and the opposite electrode, regardless of the wiring on the electro-optical device substrate.

DETAILED DESCRIPTION

A First Embodiment of an Electro-Optical Device Substrate and An Electro-Optical Device Hereinafter, a case where the present invention is applied to a liquid crystal device that is an example of the electro-optical device will be described as an example. In addition, the embodiment described below is not intended to limit the present invention as an example of the present invention. In addition, the following explanation is provided with reference to the drawings, if necessary, and in these drawings, in order to indicate important components out of a structure comprising a plurality of components so that it is easily understood, each component is indicated with relative dimensions rather than real dimensions.

Figure 1:
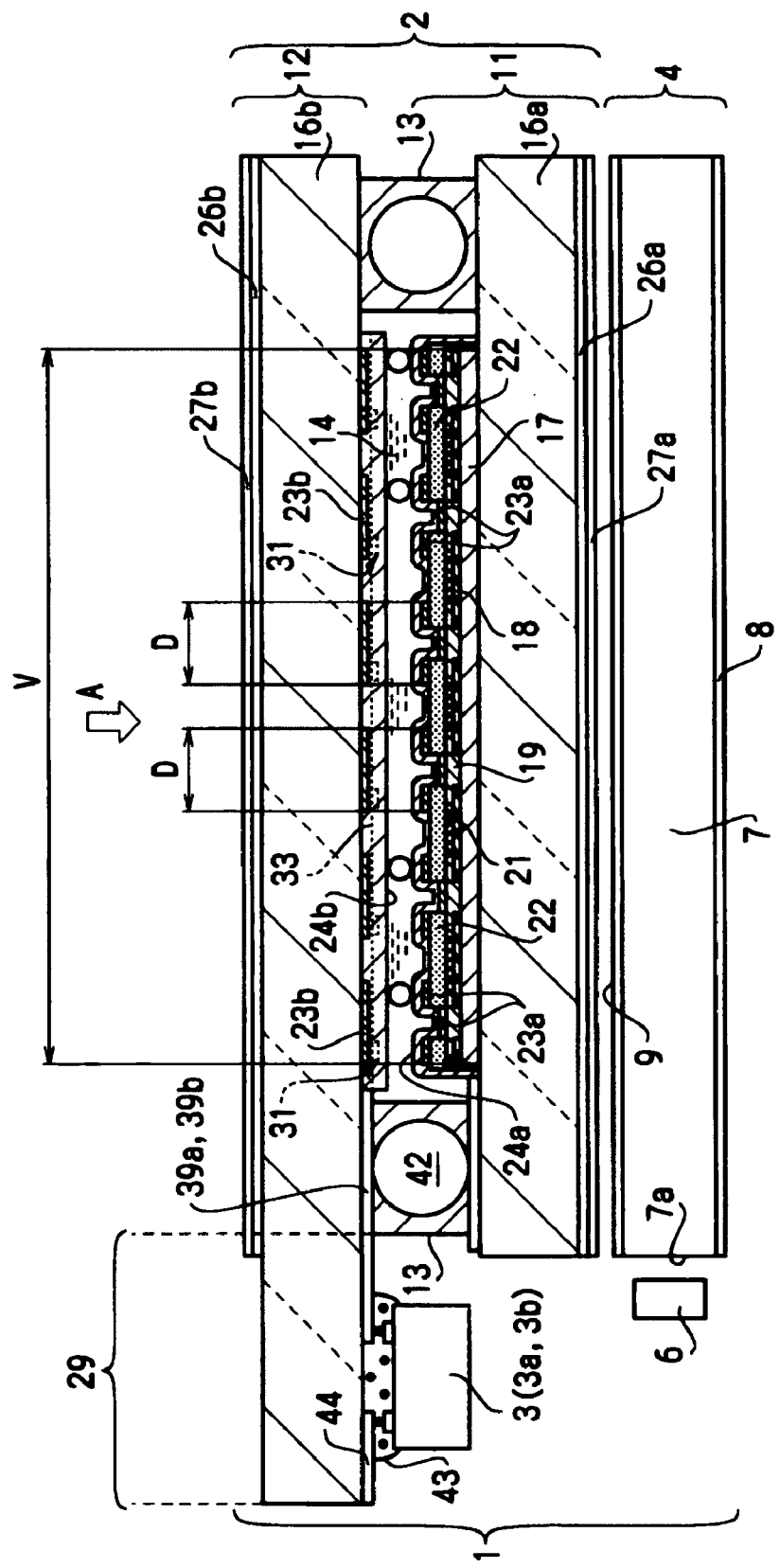
FIG. 1 is a cross-sectional view of an electro-optical device substrate and an electro-optical device according to respective embodiments of the present invention.

FIG. 1 illustrates an embodiment in which an electro-optical device according to the present invention is applied to a liquid crystal device that is an example thereof. In addition, the liquid crystal device mentioned herein, which is an active matrix type using TFD (Thin Film Diode) being a two-terminal type switching element, is a transflective liquid crystal device using an device substrate as an electro-optical device substrate. In addition, FIG. 1 illustrates an embodiment in which an electro-optical device substrate according to the present invention is applied to a liquid crystal device.

In FIG. 1, a liquid crystal device 1 comprises a liquid crystal panel 2, a driver IC 3 mounted on the liquid crystal panel 2, and an illuminating device 4. The illuminating device 4 is disposed at the rear side of the liquid crystal panel 2 when viewed from the observing side (that is, the top of the drawing) and functions as a backlight. The illuminating device 4 may function as a front light by being disposed on the observing side of the liquid crystal panel 2.

The illuminating device 4 has a light source 6 comprising a point shape of a light source such as an LED (Light Emitting Diode), a linear shape of a light source such as a cold cathode tube, or the like, and a light guider 7 formed of a light-permeable resin. When viewed from the observing side, a reflective layer 8 is disposed on the rear side of the light guider 7, if necessary. In addition, a diffusion layer 9 is disposed on the observing side of the light guider 7, if necessary. A light inlet 7a of the light guider 7 is extended in a direction perpendicular to a paper plane of FIG. 1 and light generated from the light source 6 is introduced into the light guider 7 via the light inlet 7a.

The liquid crystal panel 2 has a device substrate 12 as the electro-optical device substrate, a color filter substrate 11 as a counter substrate opposing it, and a square or rectangular shape frame type of a sealing member 13 when viewed in the direction of arrow A that bonds the substrates. A liquid crystal 14 is sealed in a gap surrounded by the substrates 11 and 12 and the sealing member 13, so called a cell gap to configure a liquid crystal layer.

The color filter substrate 11 has a first base 16a of a rectangular or square shape as viewed in the direction of arrow A. In an inner surface of the first base 16a, a resin layer 17 having unevenness, in other words, a combination of a concave portion and a non-concave portion is formed, and a reflective layer 18 is formed thereon. A colored layer 19 and a light-shielding layer 21 are formed thereon, and in turn an over coating layer 22 is formed thereon. An electrode 23a extended in a linear manner is formed thereon in a direction perpendicular to the paper plane, and in turn an alignment film 24a is formed thereon.

On the alignment film 24a, an alignment process, for example, a rubbing process is carried out, and thus, alignment of liquid crystal molecules around the first base 16a can be determined. In addition, a retardation film 26a and a polarizer 27a are mounted on the outer surface of the first base 16a by an adhesive or the like. The first base 16a is formed of, for example, a light-permeable glass, a light-permeable plastic or the like.

Figure 2:
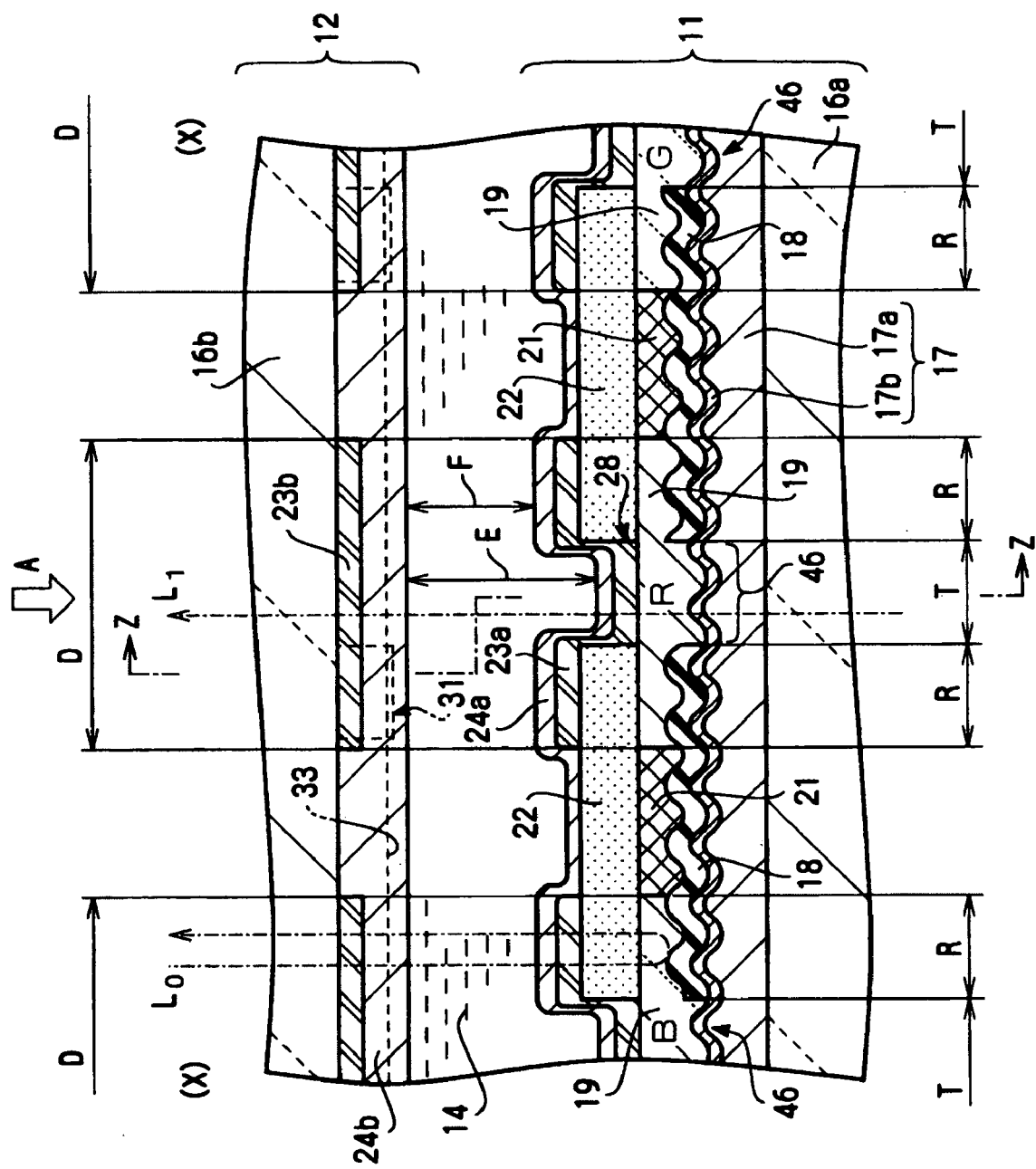
FIG. 2 is an enlarged cross-sectional view of main portions of FIG. 1 taken from the X—X line of FIG. 4.

FIG. 2 is an enlarged view illustrating the vicinity of a display dot of FIG. 1. In FIG. 2, the resin layer 17 is formed in a two-layer structure consisting of the first layer 17a and the second layer 17b, and small unevenness, in other words, a small concave portion and a small non-concave portion are formed on the surface of the second layer 17b. The reflective layer 18 is formed of, for example, Al (aluminum), Al alloy or the like. A surface of this reflective layer 18 forms an uneven shape corresponding to the unevenness attached to the resin layer 17 being a bottom layer thereof. Light that is reflected to the reflective layer 18 is diffused by this uneven shape.

Figure 4:
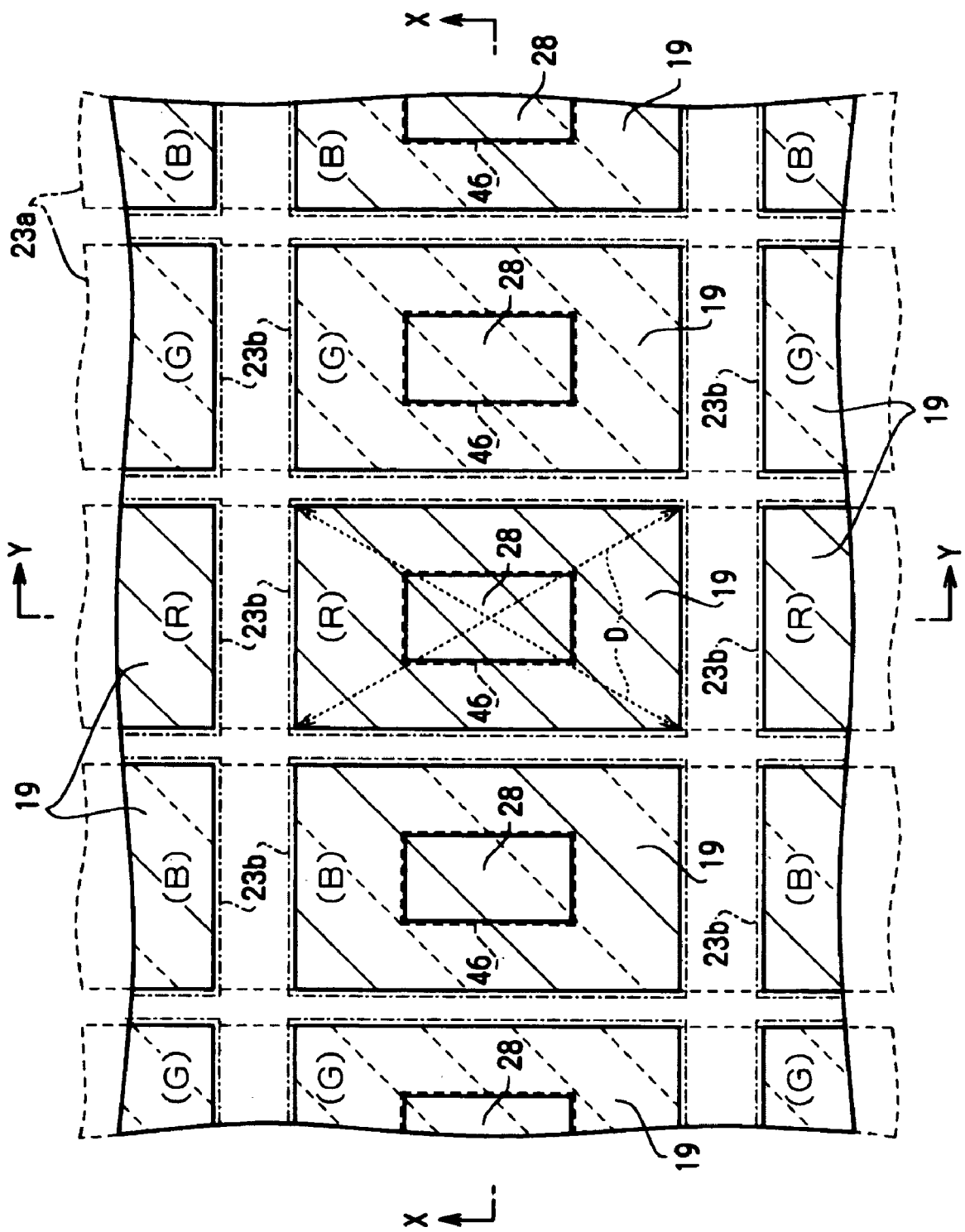
FIG. 4 is a plan view illustrating a plan structure of main portions of the structure shown in FIG. 1.

FIG. 4 illustrates a plan structure viewed in the direction of arrow A in FIG. 2. A colored layer 19 is formed of, for example, dots, each being a rectangular shape as shown in FIG. 4, and a colored layer 19 represents one of three primary colors of R (red), G (green) and B (blue). The colored layer 19 of each color is disposed in a stripe arrangement, a delta arrangement, a mosaic arrangement, or any other appropriate arrangement. FIG. 4 illustrates the stripe arrangement. In addition, the colored layer 19 can be formed of three primary colors of C (Cyan), M (Magenta) and Y (Yellow). In addition, FIG. 2 is a cross-sectional view taken by an X—X line in FIG. 4.

The light-shielding layer 21 of FIG. 1 is formed of, for example, a light-shielding material, such as Cr (chrome) or the like, to fill among the plurality of colored layers 19. This light-shielding layer 21 functions as a black matrix to improve a contrast of the image displayed by light that has transmitted through the colored layer 19. In addition, the light-shielding layer 21 is not limited to being formed of a specific material, such as Cr or the like, but can be formed by overlapping, for example, respective colored layers of R, G, and B constituting the colored layer 19, in other words, by a laminate.

The over coating layer 22 is formed of, for example, a photosensitive resin such as an acryl resin, a polyimide resin or the like. In addition, as shown in FIG. 2, a pass-through hole 28 is formed to a surface of the colored layer 19 in an appropriate place of the over coating layer 22. Alternately, in place of the pass-through hole 28, a bottom hole, in other words, a concave portion having a depth not to the surface of the colored layer 19 but into the over coating layer 22 can be formed in the over coating layer 22.

An electrode 23a that is extended in a linear form in a direction perpendicular to the paper plane of FIG. 2 is formed of, for example, a metal oxide such as ITO (Indium Tin Oxide) or the like, and is inserted into the pass-through hole 28 at a portion of the center thereof. In addition, an alignment film 24a formed thereon is formed of, for example, polyimide or the like, and the alignment film 24a is also inserted into the pass-through hole 28 at a portion corresponding to the pass-through hole 28. That is, a plurality of grooves is formed in the electrode 23a and in the alignment film 24a when viewed in plan in the direction of arrow A.

In FIG. 1, the device substrate 12 opposing the color filter substrate 11 has the second base 16b. In this second base 16b, one side thereof where a protruding portion 29 is formed protrudes outside the first base 16a. A plurality of TFDs 31 as a switching element is formed on an inner surface of the second base 16b, a plurality of dot electrodes 23b is formed to be connected to the TFDs 31, and the alignment film 24b is disposed thereon. The alignment of liquid crystal molecules around the second base 16b is determined by applying an alignment process, for example, a rubbing process to the alignment film 24b. A retardation film 26b and a polarizer 27b are mounted on an outer surface of the second base 16b by adhesive or the like.

The second base 16b is formed of, for example, a light-permeable glass, a light-permeable plastic or the like. In addition, the dot electrode 23b is formed of metal oxide such as ITO or the like. In addition, the alignment film 24b is formed of, for example, polyimide or the like.

Figure 3:
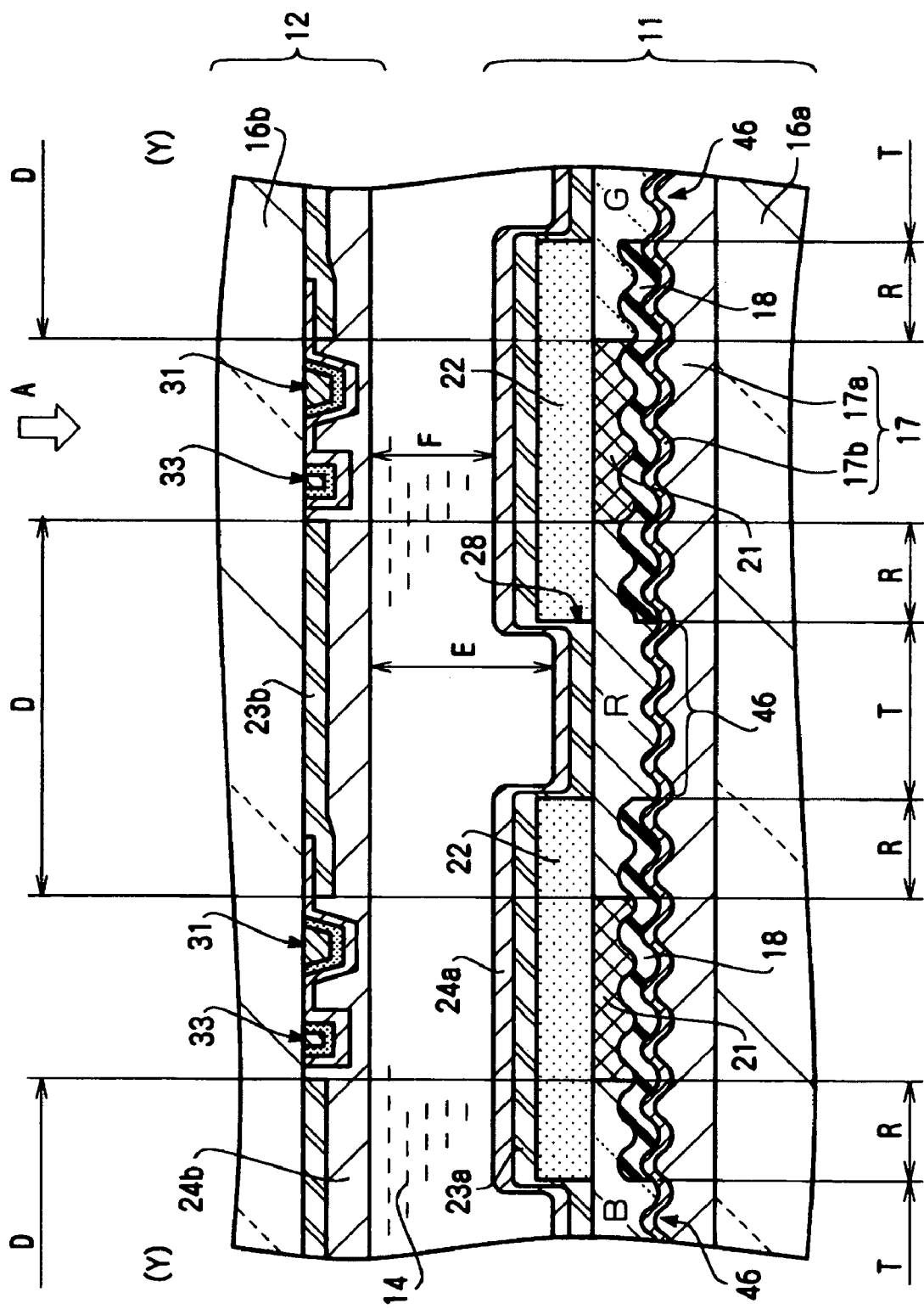
FIG. 3 is a cross-sectional view of a structure shown in FIG. 2 taken from the Y—Y line of FIG. 4.
Figure 5:
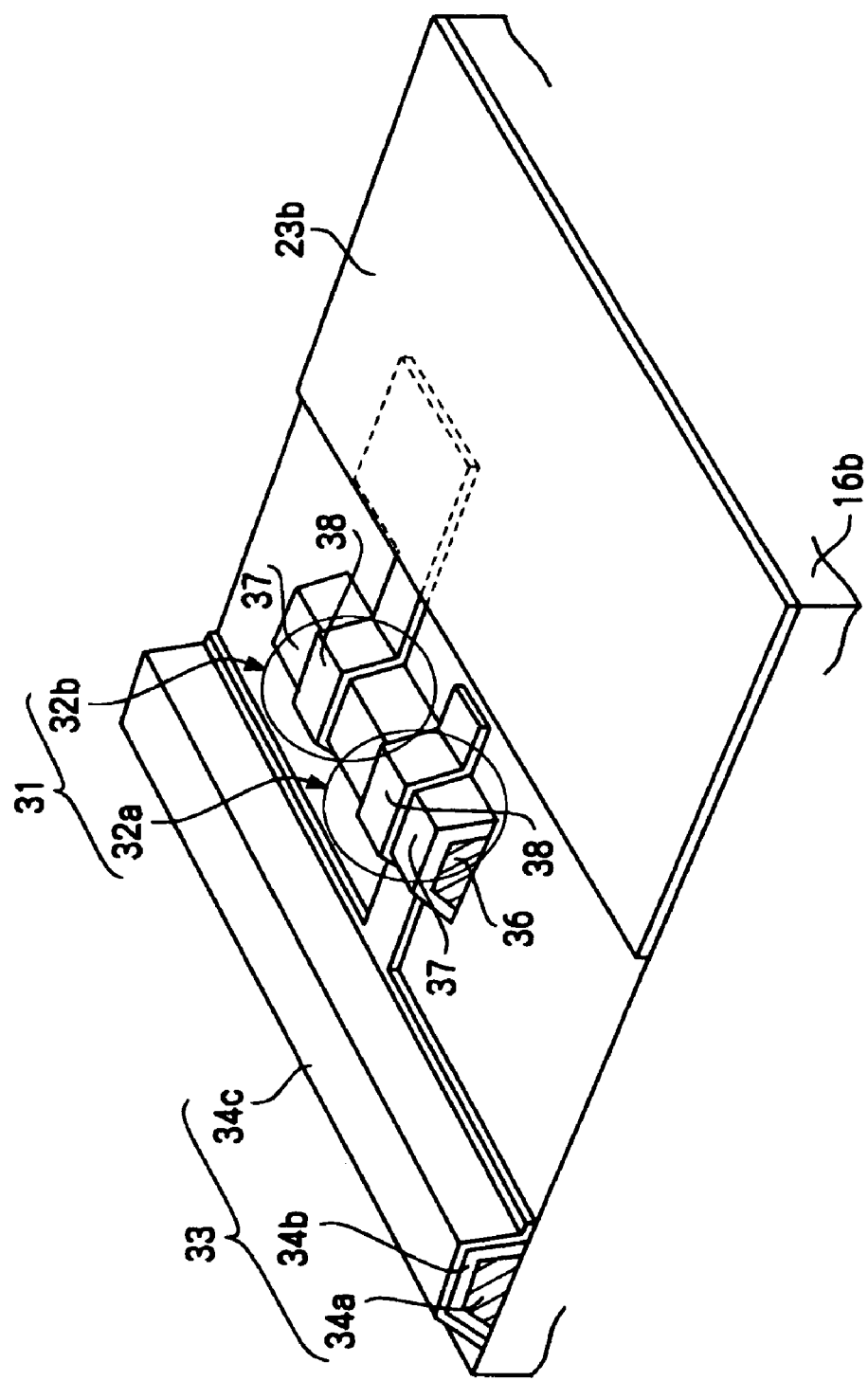
FIG. 5 is a perspective view illustrating an example of a switching device used in a device of FIG. 1.

FIG. 3 illustrates a cross-sectional view taken by the Z—Z line of FIG. 2. An individual TFD 31 is disposed in the position corresponding to the light-shielding layer 21 at the color filter substrate 11 as shown in FIG. 3. As shown in FIG. 5, it is formed of the first TFD element 32a and the second TFD element 32b in serial connection. In addition, FIG. 3 is a cross-sectional view taken from the Y—Y line of FIG. 4.

In FIG. 5, TFD 31 as an example is formed as follows. That is, a first layer 34a of the line wiring 33 and the first metal 36 of TFD 31 are first formed of TaW (tantalum tungsten). Next, a second layer 34b of the line wiring 33 and an insulating film 37 of TFD 31 are formed in an anode oxide process. Then, a third layer 34c of the line wiring 33 and the second metal 38 of the TFD device 31 are formed by Cr (chrome).

In FIG. 3, the linear electrode 23a formed on the color filter substrate 11 is extended along a left and right directions of a paper plane of the drawing. In addition, the above-stated line wiring 33 formed on the device substrate 12 is extended in a direction perpendicular to the linear electrode 23a, in other words, in a direction perpendicular to the plane of the figure.

In FIG. 5, the second metal 38 of the first TFD element 32a is extended from the third layer 34c of the line wiring 33. In addition, a dot electrode 23b is formed to overlap the front end of the second metal 38 of the second TFD element 32b. Considering that an electrical signal flows in the line wiring 33 toward the dot electrode 23b, an electric signal flows in the order of the second electrode 38→the insulating film 37→the first metal 36 in the first TFD element 32a along the current direction. On the other hand, an electric signal flows in the second TFD element 32b in an order of the first metal 36→the insulating film 37→the second metal 38.

That is, a pair of TFD elements in an electrically opposite direction is interconnected in series between the first TFD element 32a and the second TFD element 32b. The structure is typically called a back-to-back structure, and it is known that the TFD device of this structure has a stable property as compared to a case where the TFD device is composed of only one TFD element. In addition, in order that peeling of the first metal 36 or the like from the second base 16b is prevented, or impurities from the second base 16b are not diffused into the first metal 36 or the like, a bottom layer (not shown) may be disposed between the TFD 31 and the base 16b, and between the line wiring 33 and the base 16b.

Figure 6:
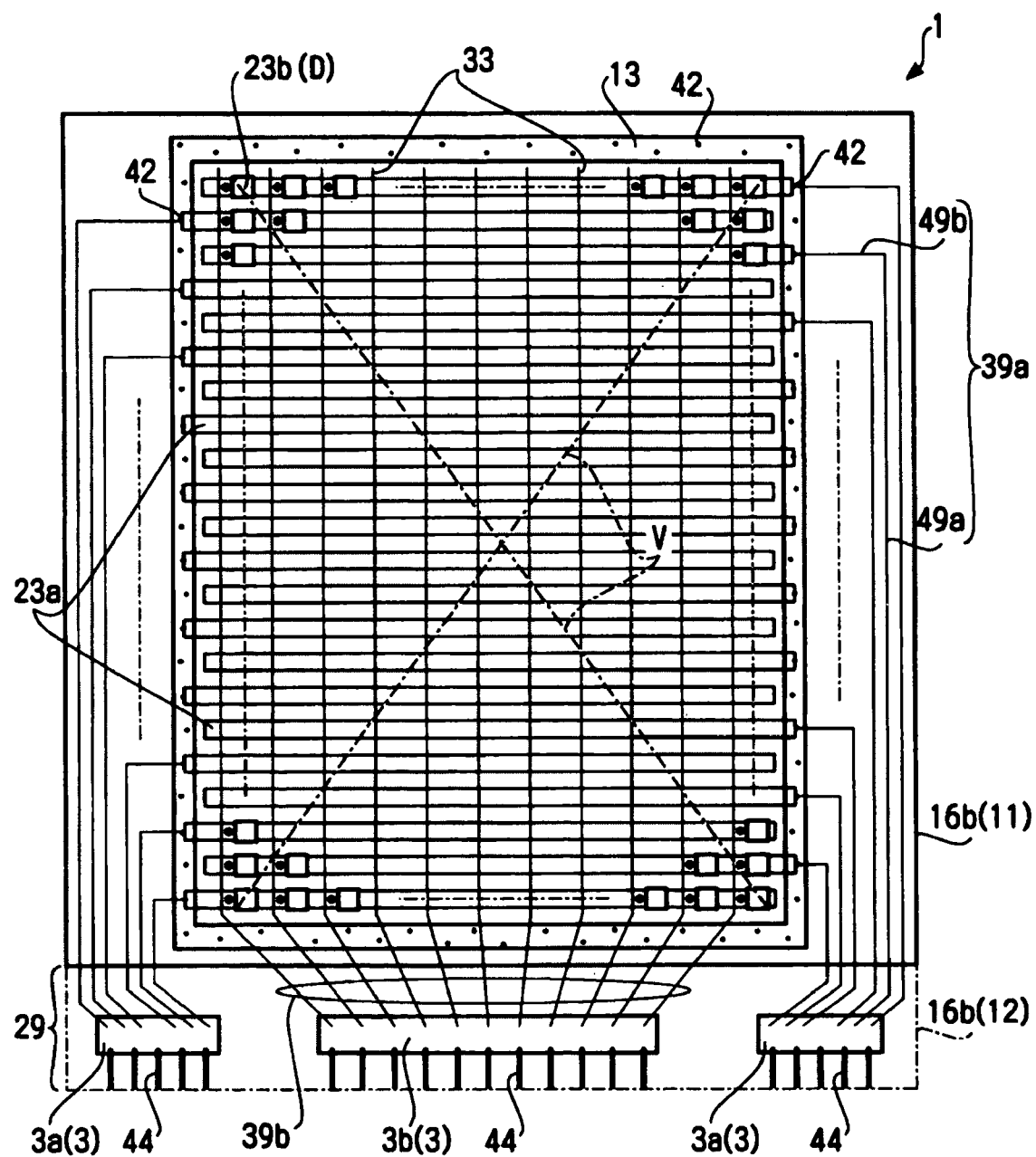
FIG. 6 is a plan view of a liquid crystal device 1 along the arrow A of FIG. 1.

FIG. 6 illustrates a plan structure of a liquid crystal device 1 along arrow A of FIG. 1. In addition, FIG. 6 illustrates an electrode and a wiring largely, and in the drawing, other elements are omitted. In addition, in FIG. 6, the second base 16b constituting the device substrate 12 is indicated by a virtual line.

Figure 7:
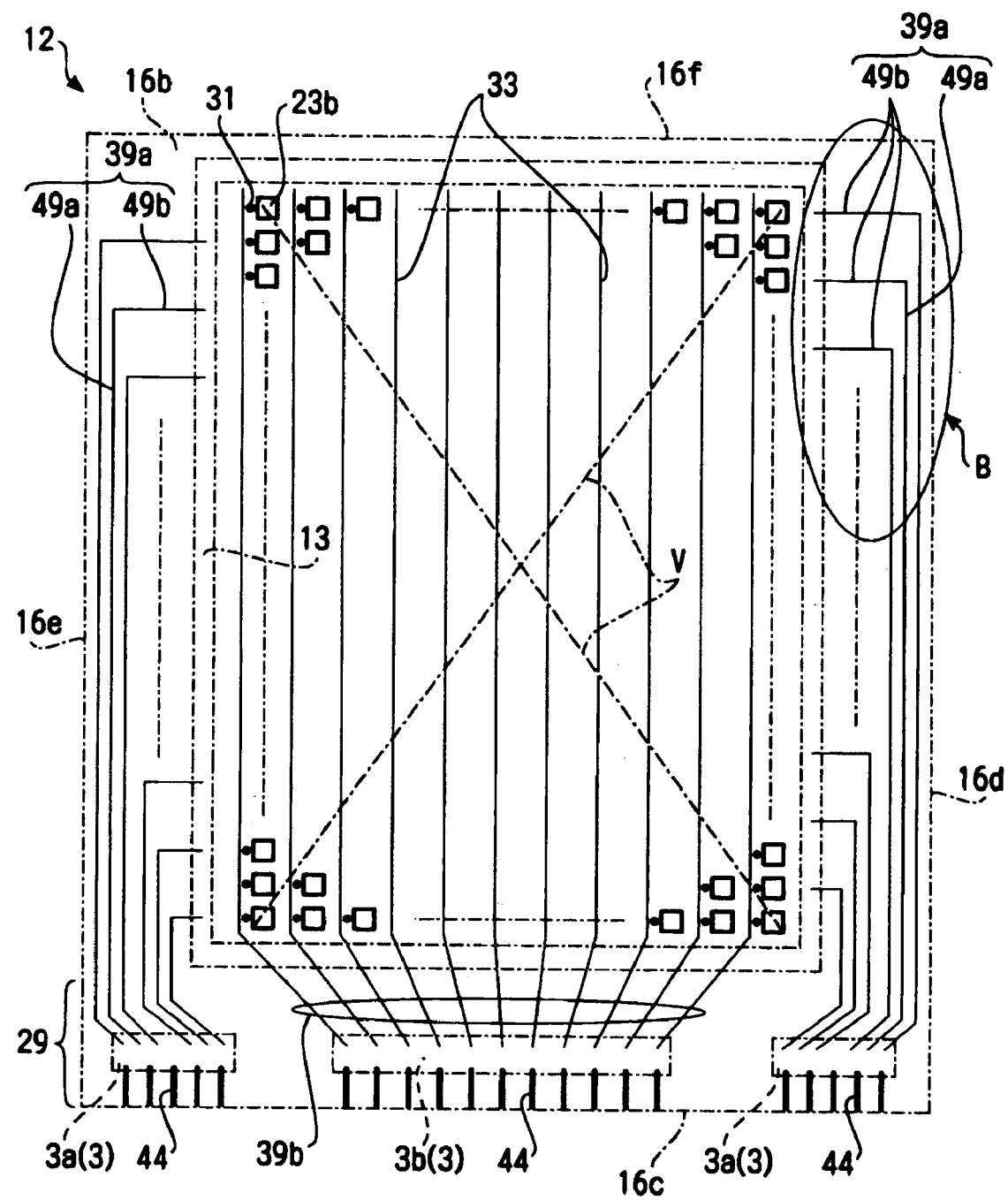
FIG. 7 is a plan view illustrating a device substrate along the arrow A of FIG. 1.

In the device substrate 12, a plurality of linear shape line wirings 33 is entirely disposed in the form of a stripe as shown in FIG. 7. In addition, a plurality of TFDs 31 is connected to individual line wirings 33 with an appropriate gap, and a dot electrode 23b is connected to the TFDs 31. In FIG. 7, although the line wiring 33 is schematically drawn by a small number of lines, in practice, many lines, for example about 240 lines are formed. In addition, although only a portion in which the TFD 31 and the dot electrode 23b corresponding to four edge portions of the sealing material 13 is shown in part, they are, in practice, disposed in the entire region surrounded by a sealing material 13. In addition, while a small number is drawn in order to schematically draw the TFD 31 and the dot electrode 23b in a large scale, in practice, for example, about 320 TFDs and dot electrodes are formed in a longitudinal direction of FIG. 7, in other words, a first row of up and down directions, respectively. That is, the number of the dot electrode 23b is arranged in arrays of, for example, length×width=320×240.

Figure 8:
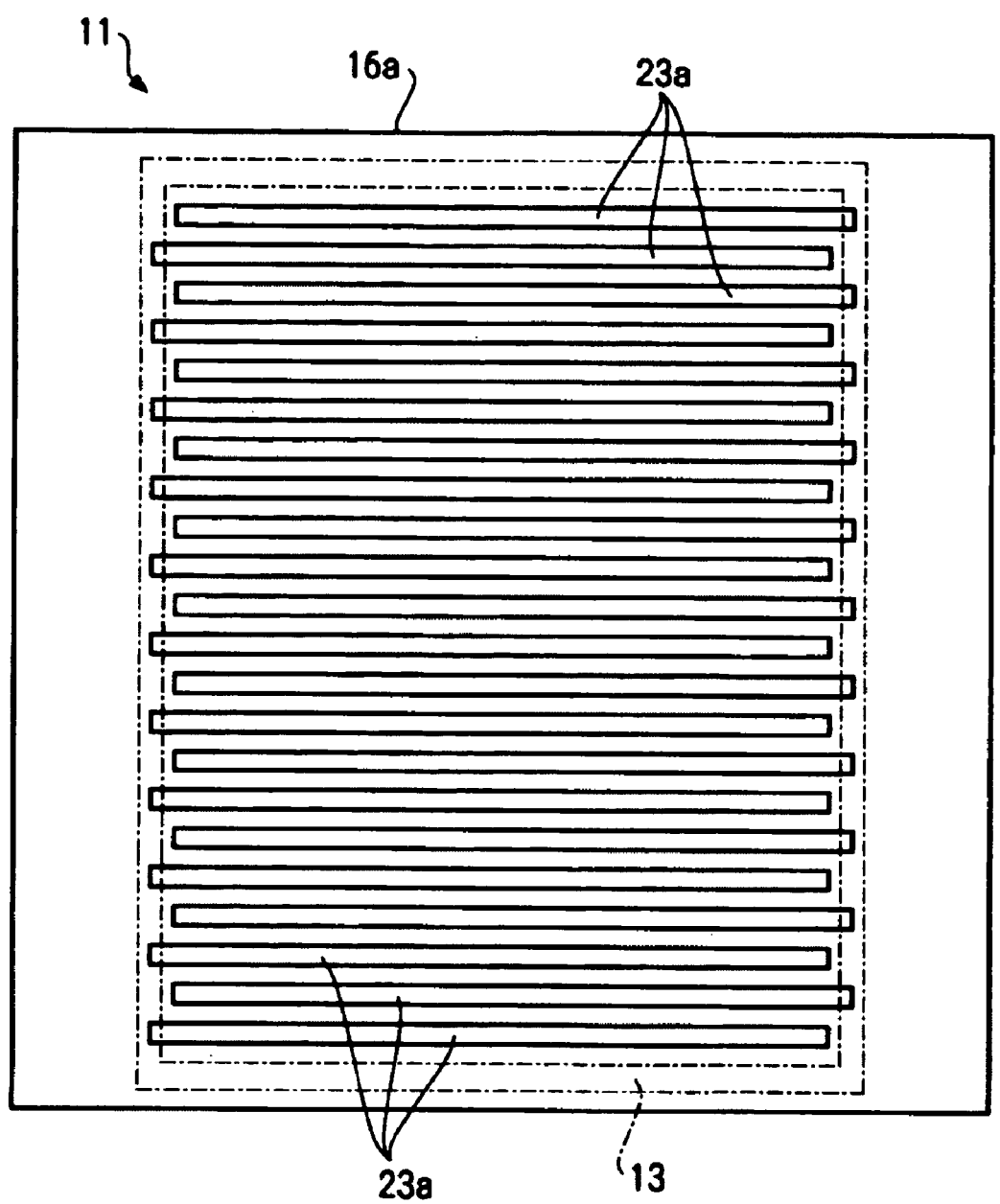
FIG. 8 is a plan view illustrating a color filter substrate along the arrow A of FIG. 1.

A plurality of linear electrodes 23a is entirely formed in the stripe form in the color filter substrate 11 opposing the device substrate 12, as shown in FIG. 8. These electrodes 23a overlap a plurality of dot electrodes 23b in a plan view, which are extended in a direction perpendicular to the line wiring 33 and forms a horizontal row when the device substrate 12 is bonded to the color filter substrate 11 by the sealing member 13 as shown in FIG. 6.

Thus, the region where the linear electrode 23a and the dot electrode 23b overlap each other forms a display dot, which is a minimum unit of the display. This display dot is a region indicated by a reference numeral D in FIGS. 1 to 4. A region where a plurality of display dots D is arranged in a longitudinal direction and a horizontal direction in a matrix shape is a display region V. An image such as a character, a number, a figure or the like is displayed on this display region V.

In FIG. 7, the driver IC 3 mounted on the protruding portion 29 of the second base 16b constituting the device substrate 12 is composed of a driver IC 3a for outputting a scanning signal, and a driver IC 3b for outputting a data signal. External connection terminals 44 are formed in the first side 16c of the second base 16b, in other words, a side of the input, and the external connection terminals 44 are connected to the input terminal, for example, an input bump of the driver ICs 3a and 3b.

In addition, a plurality of wirings 39a is formed around two sides 16d and 16e adjacent to the first side 16c along edges of the sides. These wirings 39a are extended from output terminals, for example, output bumps of the driver ICs 3a and 3b toward the second side 16f opposing the first side 16c. Each wiring line 39a is composed of a main line portion 49a parallel with two sides 16d and 16e, respectively, and a portion 49b that is bent in about 90° with respect to the main line portion.

Figure 9:
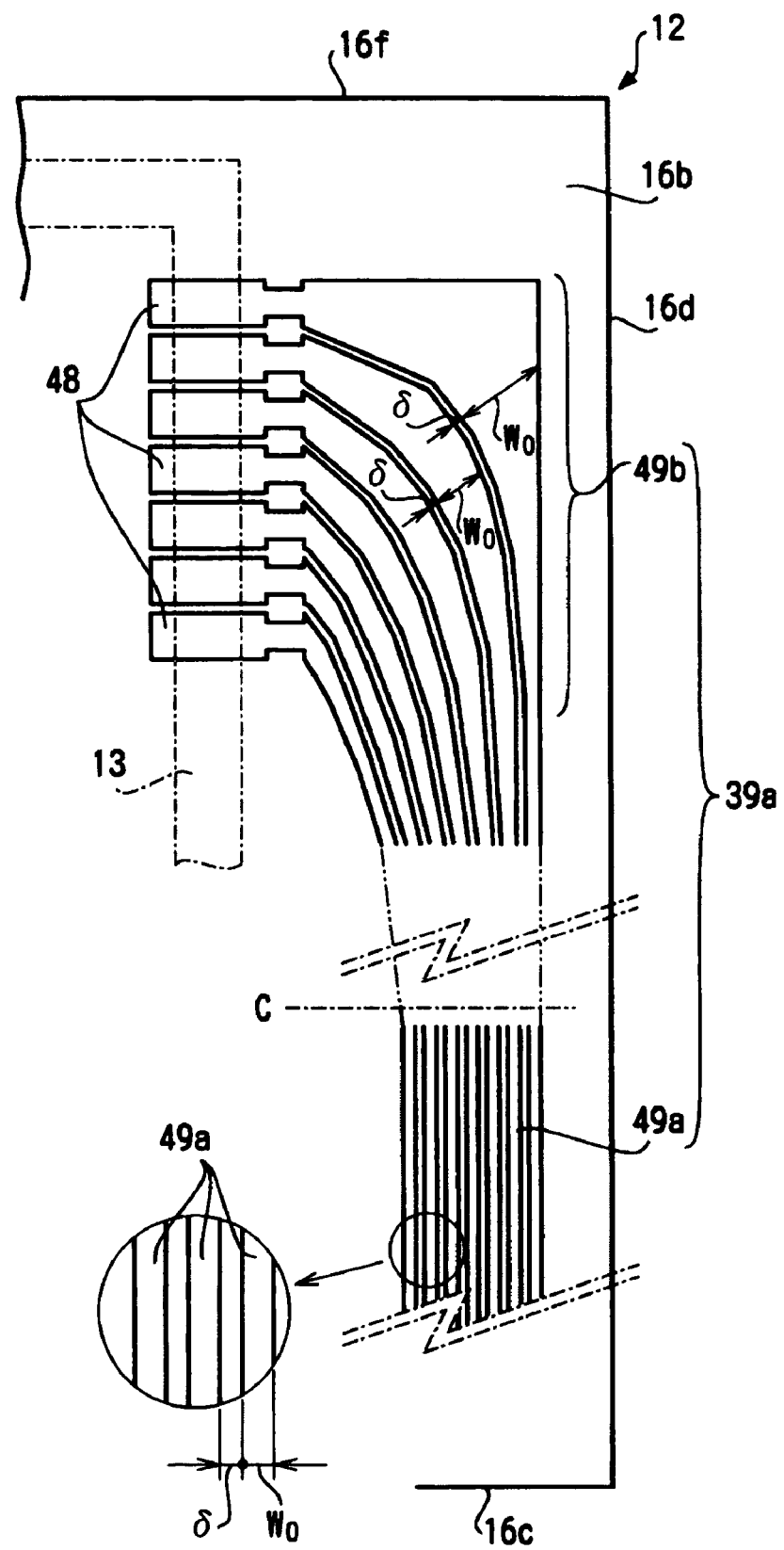
FIG. 9 is an enlarged plan view illustrating a portion indicated by the arrow B of FIG. 7.

FIG. 9 is an enlarged view of wirings 39a of a portion indicated by arrow B in FIG. 7. As shown in FIG. 9, a conductive pad 48 is formed in the front end of the bent portion 49b of the wirings 39a. The line width W0 of the main line portion 49a of the wirings 39a is about 4 µm, and an interval δ between the wirings is about 3 µm. In the main line portion 49a of the wirings 39a, the line width W0 and the wiring gap δ are uniform.

On the other hand, the line width W0 of the wirings 39a, through the front end of the bent portion 49b from a point C where the main line portion 49a is terminated, is slowly and continuously widened as it is spaced apart from the main line portion 49a. Accordingly, the wiring resistance of the wirings 39a is suppressed to be low.

In addition, the line width W0 of the wirings 39a is larger by the wiring, which extends far with respect to the main line portion 49a. Accordingly, the line width W0 is adapted to be largest at the wiring in which the wiring resistance is smaller to a great extent. As a result, it is possible to make the wiring resistance uniform over all the wirings from the wirings 39a having a short length to the wirings 39a having a long length. In addition, a gap between the adjacent wirings 39a is made uniform on the order of δ=3 µm as in the main line portion 49a even in a portion whose line width W0 is larger.

In FIG. 6, a spherical or cylindrical conductive material 42 is included in an irregular dispersion state inside the sealing member 13. When the device substrate 12 shown in FIG. 7 and the color filter substrate 11 shown in FIG. 8 are bonded as shown in FIG. 6, a pad 48 of the bent portion 49b of the wirings 39a at the device substrate 12 (see FIG. 9) and an end portion of the linear electrode 23a at the color filter substrate 11 are conducted by the conductive material 42. Accordingly, the electrode 23a at the color filter substrate 11 is electrically connected to the driver IC 3a via the wirings 39a at the device substrate 12.

In addition, conduction of the linear electrode 23a and the wirings 39a are alternately realized between the left side and the right side in FIG. 6. However, instead, a driving method may be applied in which conduction of an upper half of the display region V is carried out in one of either a left side or a right side, and conduction of the lower half of the display region V is carried out in the other of either a left side or a right side.

In FIG. 7, the line wiring 33 formed on the device substrate 12 is connected to the output terminal, for example, the output bump of the driver IC 3b via the wiring 39b formed on the same device substrate 12. The wirings 39a and 39b are formed of elemental Cr, Cr/Ta (i.e., a laminated structure in which the first layer is Ta and the second layer is Cr), ITO/Cr/Ta (i.e., a laminated structure in which the first layer is Ta, the second layer is Cr, and the third layer is ITO), or the like. These wirings 39a and 39b can be simultaneously formed when the TFD 31 or the dot electrode 23b is formed on the device substrate 12.

In addition, on the protruding portion 29 of the device substrate 12 of FIG. 1, the driver IC 3 is mounted by ACF (Anisotropic Conductive Film) 43. ACF 43 is formed by dispersing conductive particles in a thermosetting resin or ultraviolet setting resin. The body portion of the driver IC 3 is fixed on the protruding portion 29 of the substrate by the thermosetting resin or the like. In addition, the output bump of the driver IC 3 and the wirings 39a and 39b, and also the input bump of the driver IC 3 and an external connection terminal 44 are electrically connected by conductive particles included in the ACF 43.

A wiring substrate not shown, for example, a flexible wiring substrate is connected to the external connection terminal 44 by a conductive connection means such as soldering, ACF, heat seal or the like. A signal, a power or the like are supplied from an electronic apparatus, for example, a cellular phone or a portable information terminal to the liquid crystal device 1 via the wiring substrate.

In FIG. 4, individual display dots D have substantially identical regions as that of the dot electrode 23b. In addition, although dot electrodes 23b indicated by a dashed line are drawn to be slightly larger than the colored layer 19 indicated by a solid line, this is intended to easily show the structure in which, in practice, the plane shapes overlap one another in a substantially identical shape. In addition, each colored layer 19 of the dot shape is formed to correspond to each display dot D.

In FIGS. 2 and 3, openings 46 corresponding to respective display dots D are disposed in the reflective layer 18. These openings 46 are formed in rectangular shapes in a plan view as shown in FIG. 4. In addition, while the openings 46 indicated by a broken line in FIG. 4 are drawn to be slightly larger than the pass-through hole 28 of the over-coating layer 22 indicated by a solid line, both edge thereof are substantially consistent in a plan view.

In the case where the color display is carried out using the colored layer 19 composed of three colors of R, G, and B as in the present embodiment, one pixel is formed by three display dots D corresponding to three colored layers 19, which correspond to the three colors of R, G, and B. On the other hand, in the case where a mono color display is achieved in black and white or in a voluntary one color, one pixel is formed by one display dot D.

In FIGS. 2 and 3, among the respective display dots D, a portion R where the reflective layer 18 is disposed is a reflecting portion, and a portion T in which the opening 46 is formed is a transmitting portion. External light incident from the observing side, in other words, external light L0 incident from the device substrate 12 (see FIG. 2) is reflected by the reflecting portion R.

On the other hand, the light L1 (see FIG. 2) emitted from the light guider 7 of the illuminating device 4 of FIG. 1 transmits through the transmitting portion T.

According to the present embodiment configured as above, if external light such as sunlight, interior light or the like is intensive, the external light L0 is reflected by the reflecting portion R toward the liquid crystal layer 14. Accordingly, a reflective display is achieved. On the other hand, when the illuminating device 4 of FIG. 1 is on, the light on the plane emitted from the light guider 7 is supplied to the liquid crystal layer 14 through the transmitting portion T of FIG. 2. Accordingly, a transmissive display is achieved. A transflective display is achieved by optionally selecting and carrying out such reflective display and transmissive display.

While the linear electrode 23a and the dot electrode 23b exist with the liquid crystal layer 14 interposed between them, the linear electrode 23a is applied with a scan signal in the present embodiment. On the other hand, while the linear electrode 23a and the dot electrode 23b exist, the dot electrode 23b is applied with the data signal in the present embodiment. TFD 31 attached to the display dot D, to which the scan signal and the data signal have been applied, turns on, and the alignment state of the liquid crystal molecules in an associated display dot D maintains so the light passing through the display dot D is modulated.

In addition, a desired image, such as a character, a number, a figure or the like, is displayed on an outer side of the device substrate 12 according to whether or not the modulated light passes through the polarizer 27b of FIG. 1. A case where the display is effected using external light L0 is a reflective display, and a case where the display is effected using transmitted light L1 is a transmissive display.

When a reflective display is performed, reflected light L0 passes through the liquid crystal layer 14 two times. In addition, when a transmissive display is effected, transmitted light L1 passes through the liquid crystal layer 14 one time. As a result, if the layer thickness of the liquid crystal layer 14 is uniform over the reflecting portion R and the transmitting portion T, there arises a difference in distances of passing through the liquid crystal layer 14 between the reflective display using reflected light L0 and the transmissive display using transmitted light L1, and thus there may be a problem to make display quality different between the reflective display and the transmissive display.

In the present embodiment, by preparing a pass-through hole 28 in the over coating layer 22, the layer thickness E of the liquid crystal layer 14 in the transmission portion T is large and the layer thickness F in the reflecting portion R is small, uniform display quality is obtained between the reflective display and the transmissive display.

In the present embodiment, as shown in FIG. 7, the wirings 39a are extended for the large distance along sides 16d and 16e of a second base 16b constituting the device substrate 12. When the wirings 39a. are extended over a large distance, wiring resistance increases and in turn crosstalk is generated. As a result, the display may be scattered. Correspondingly, in the present embodiment, as shown in FIG. 9, since the wirings 39a are provided with a portion whose line width W0 gradually increases, the resistance of the wirings 39a may decrease. Thus, when the number of display dots D is as much as 320×240 in definition as in the present embodiment, the generation of the crosstalk can be prevented, and in turn the display is not scattered.

Modifications

In the aforementioned embodiments, the wirings 39a as shown in FIG. 9 were used. The wirings 39a have a portion whose line width increases in the bent portion 49a. However, the portion whose line width is widened may be disposed at places other than the bent portion 49b.

Figure 10:
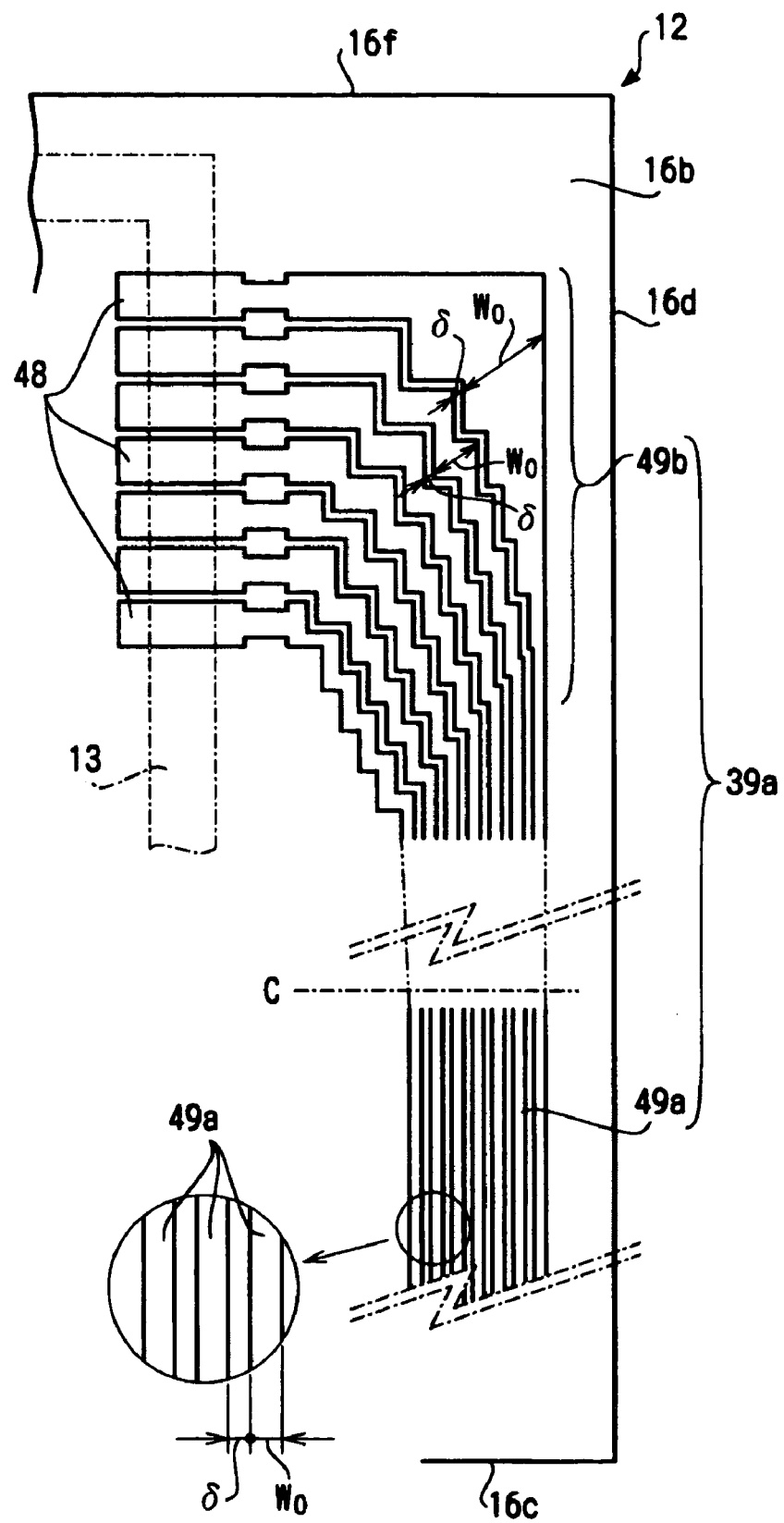
FIG. 10 illustrates a modification example for the structure of FIG. 9.

In addition, in the embodiment of FIG. 9, the line width W0 of the wirings 39a is adapted to gradually increase in the bent portion 49b. In place of this configuration, the wirings 39a may be formed for the line width W0 thereof to gradually increase step by step at the bent portion 49b as shown in FIG. 10.

In the above embodiment, the present invention has been applied to the wirings 39a formed on the device substrate 12. However, if necessary, the present invention may be applied to the wiring 39b of FIG. 7. Because the wiring 39b has a short length, the wiring resistance would not decrease by intentionally applying the present invention.

In the above embodiment, the present invention has been applied to the wirings 39a formed on the device substrate 12. However, in the case where any wiring is formed on the color filter substrate 11, the present invention may be applied to the wiring at the color filter substrate. That is, the color filter substrate 11 may be the electro-optical device substrate according to the present invention.

In addition, although in the embodiment, the present invention has been applied to the liquid crystal device using TFD, it may be applied to an active matrix type liquid crystal device using a two-terminal type switching device rather than the TFD. In addition, the present invention may be applied to the active matrix type liquid crystal device using a three-terminal type switching device, such as TFT (Thin Film Transistor) or the like. Furthermore, the present invention may be applied to a simple matrix type liquid crystal device that does not use a switching device.

In addition, the present invention may be applied to electro-optical devices in addition to the liquid crystal device, for example, an organic EL device, an inorganic EL device, a plasma display device (PDP), an electrophoretic display (EPD), and a field emission display device (FED).

An Embodiment of the Electronic Apparatus

Figure 11:
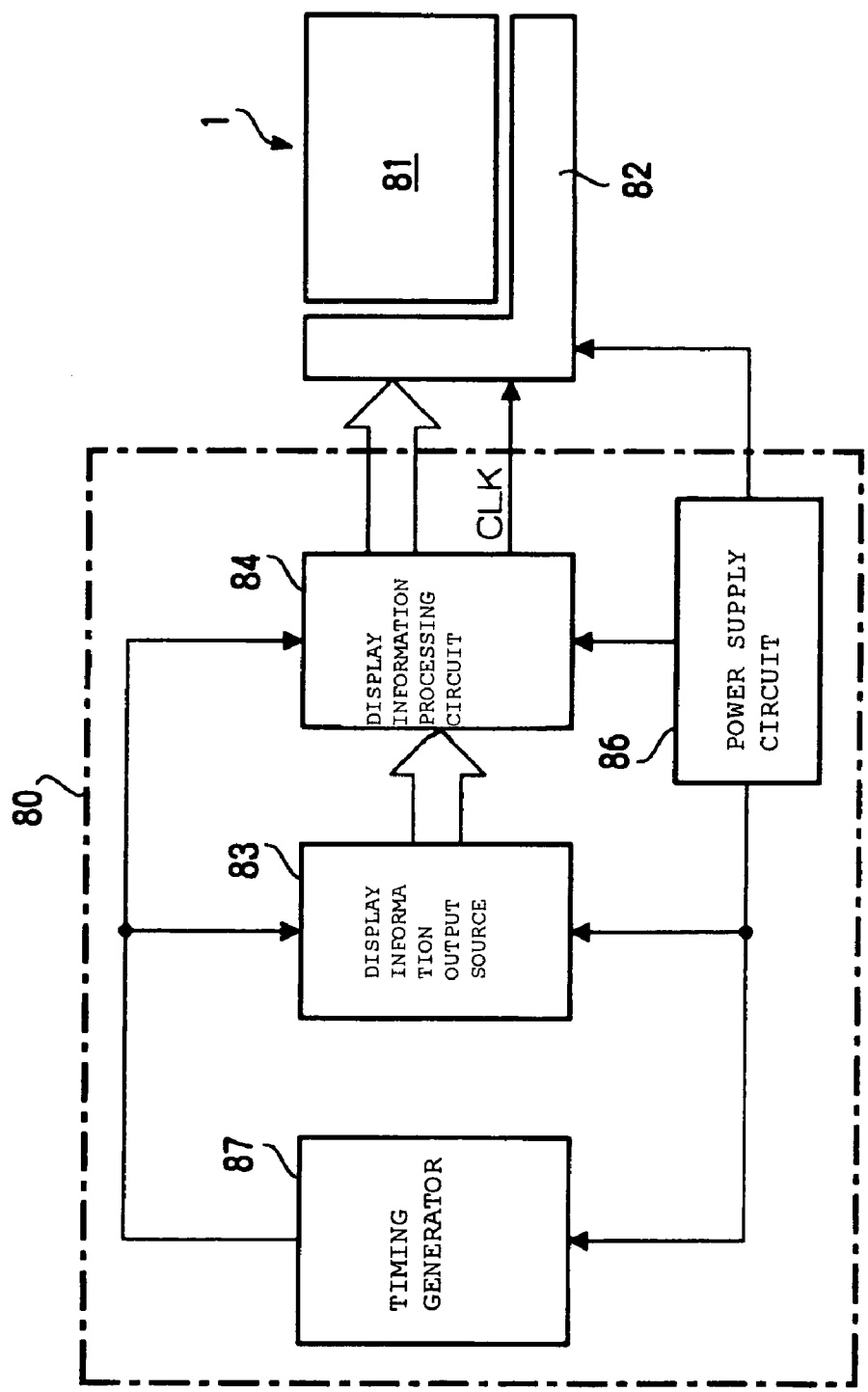
FIG. 11 is a block diagram illustrating an electronic apparatus according to an embodiment of the present invention.

Next, an embodiment of an electronic apparatus according to the present invention will be described with reference to the drawings. FIG. 11 is a block diagram of an embodiment of the electronic apparatus. The electronic apparatus illustrated herein has a liquid crystal device 1 and a control means 80 for controlling the liquid crystal device 1. The liquid crystal device 1 has a liquid crystal panel 81 and a driver circuit 82 composed of a semiconductor IC or the like. In addition, the control means 80 has a display information output source 83, a display information processing circuit 84, a power supply circuit 86, and a timing generator 87.

The display information output source 83 has a memory composed of a ROM (Read Only Memory), a RAM (Random Access Memory) or the like; a storage unit such as a magnetic recording disk, optical recording disk or the like; and a tuning circuit for tuning outputting a digital image signal. It is composed to supply display information in the form of a predetermined format of a video signal or the like to the display information processing circuit 84 based on various clock signals produced by the timing generator 87.

The display information processing circuit 84 comprises known various circuits such as a serial-parallel converting circuit, an amplifying/inverting circuit, a rotation circuit, a gamma correcting circuit, a clamping circuit or the like to carry out inputted display information processing, so that the image information along with a clock signal (CLK) is supplied to the driver circuit 82. The driver circuit 82 includes a scan line driver circuit, a data line driver circuit, and a checking circuit. In addition, the power supply circuit 86 supplies a predetermined voltage to each of the above-stated components.

Figure 12:
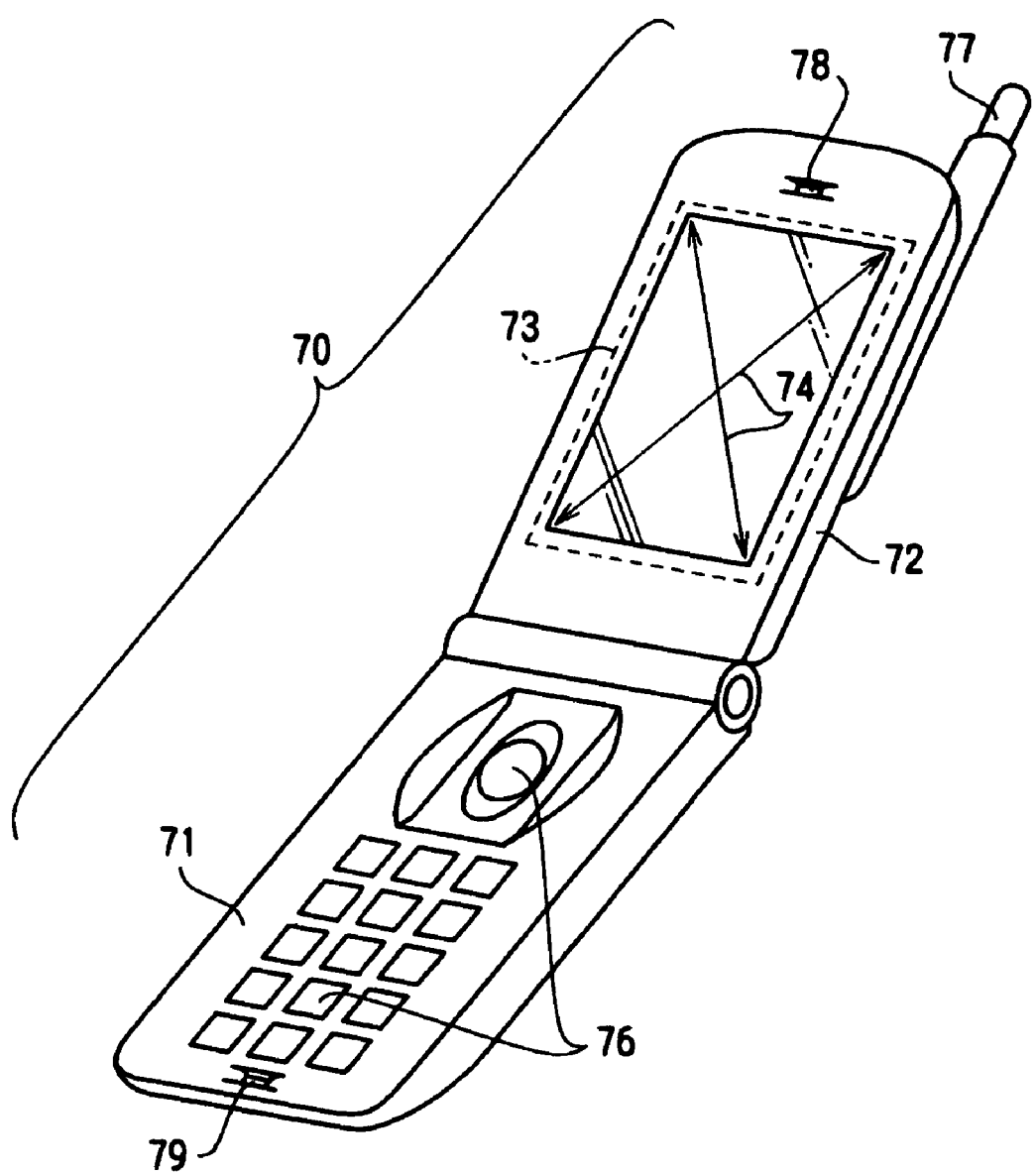
FIG. 12 is a perspective view of a cellular phone that is an electronic apparatus according to another embodiment of the present invention.

FIG. 12 illustrates an embodiment in which the present invention is applied to a cellular phone being an example of the electronic apparatus. The cellular phone 70 illustrated herein has a body portion 71, and a display body portion 72 prepared therein in an open and close manner. The display device 73 composed of an electro-optical device, such as the liquid crystal device or the like, is disposed in the display body portion 72, which enables visual confirmation of various displays regarding phone communication through the display screen 74 at the display body portion 72. An operation button 76 is arranged and prepared at the front face of the body portion 71.

A retractable antenna 77 is mounted to one end of the display body portion 72. A speaker is disposed inside the earpiece 78 while a microphone is mounted inside a mouthpiece 79. A control unit for controlling the operation of the display device 73 is included in the body portion 71 or the display body portion 72 as a portion of a control unit responsible for a control of the entire cellular phone, or separately from the control unit.

Figure 13:
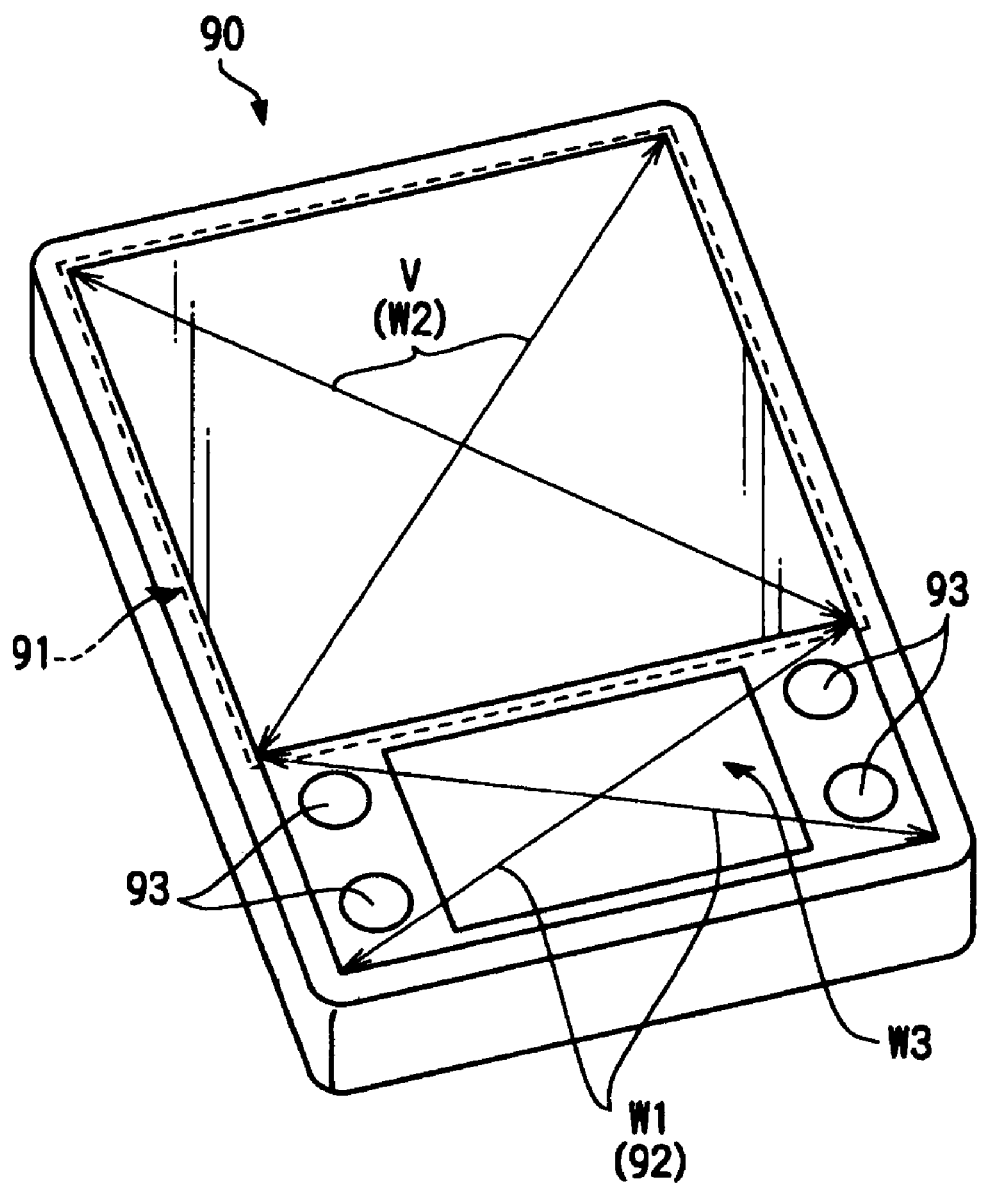
FIG. 13 is a perspective view of a portable information terminal that is an electronic apparatus according to another embodiment of the present invention.

FIG. 13 illustrates an embodiment in which the present invention is applied to a portable information device being another example of the electronic apparatus. A portable information device 90 illustrated herein is an information device having a touch panel, and has a liquid crystal device 91 as an electro-optical device. The information device 90 has a display region V composed of a display plane of the liquid crystal device 91, and a first input region W1 positioned beneath the display region V. An input sheet 92 is disposed at the first input region W1.

The liquid crystal device 91 has a structure in which a liquid crystal panel has a rectangular or square shape and a touch panel has the same rectangular or square shape overlap in a plan view. The touch panel functions as an input panel. The touch panel is larger than the liquid crystal panel and has a shape protruded from an end of the liquid crystal panel.

Since a touch panel is disposed in the display region V and the first input region W1, a region corresponding to the display region V also functions as a second input region W2 that can be input-operated like the first input region W1. The touch panel has a second face positioned at the liquid crystal panel and a first face opposing it, and an input sheet 92 is attached at a position corresponding to the first input region W1 of the first face.

A frame for identifying an icon 93 and a self-scripted character recognition region W3 is printed on the input sheet 92. For the first input region W1, since a load from an input means such as a finger or a pen is applied on the first face of the touch panel through the input sheet 92, selection of the icon 93 or data input, such as character input in the character recognition region W3 or the like, can be carried out.

On the other hand, for the second input region W2, the image on the liquid crystal panel can be viewed and also, for example, an input mode screen may be displayed on the liquid crystal panel, and a load of a finger or a pen is applied on the first face of the touch panel. Thus, data input or the like can be carried out since an appropriate position in the input mode screen can be specified.

Modifications

An electronic apparatus according to the present invention may include, for example, a personal computer, a liquid crystal TV, a digital still camera, a wrist watch, a viewfinder or a monitor direct type video tape recorder, a car navigation device, a pager, an electronic organizer, a calculator, a word processor, a workstation, a TV phone, a POS terminal, and other devices, in addition to the above-stated cellular phone or portable information device.

Figure 14:
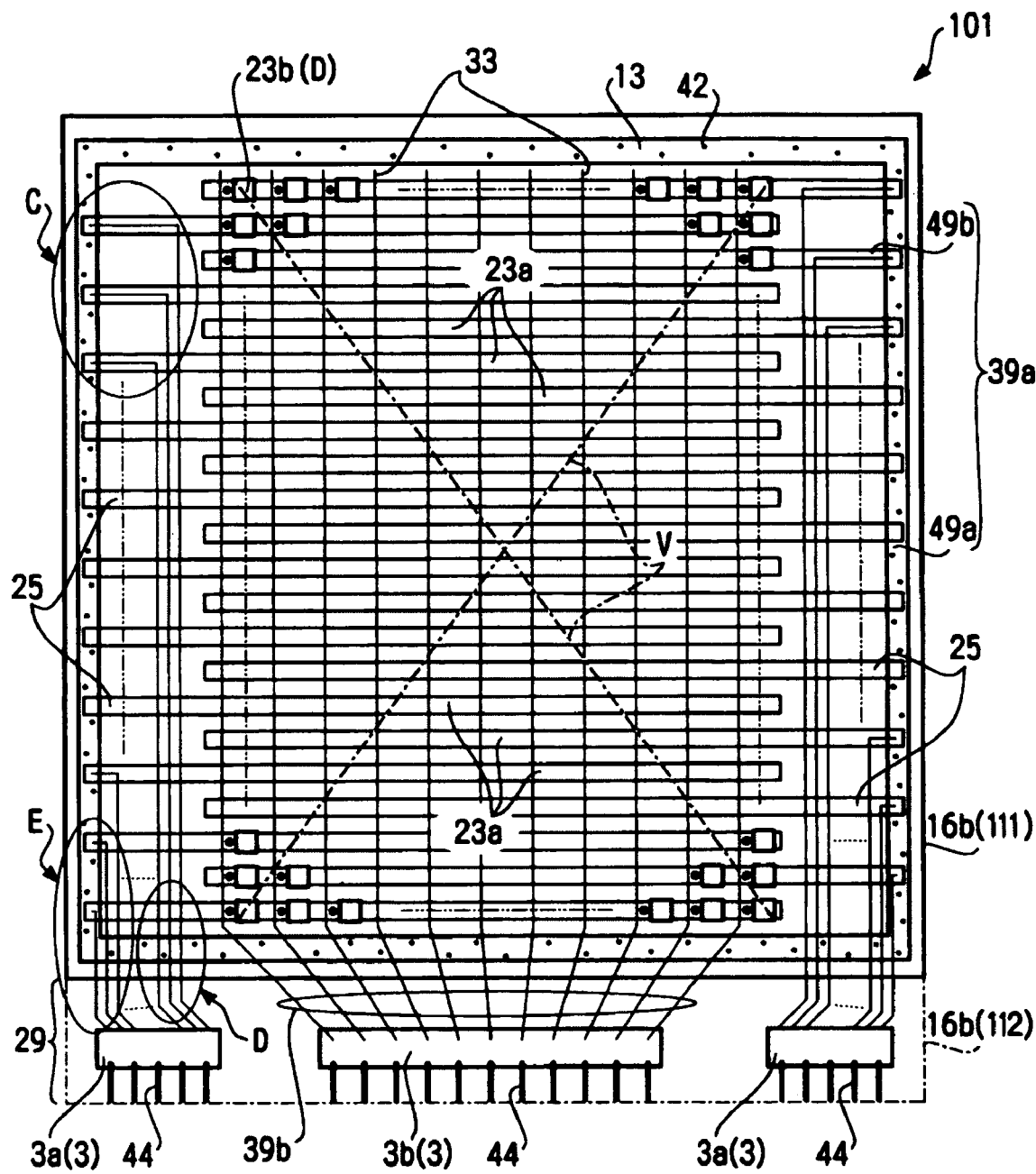
FIG. 14 is a plan view illustrating an electro-optical device according to another embodiment of the present invention.
Figure 15:
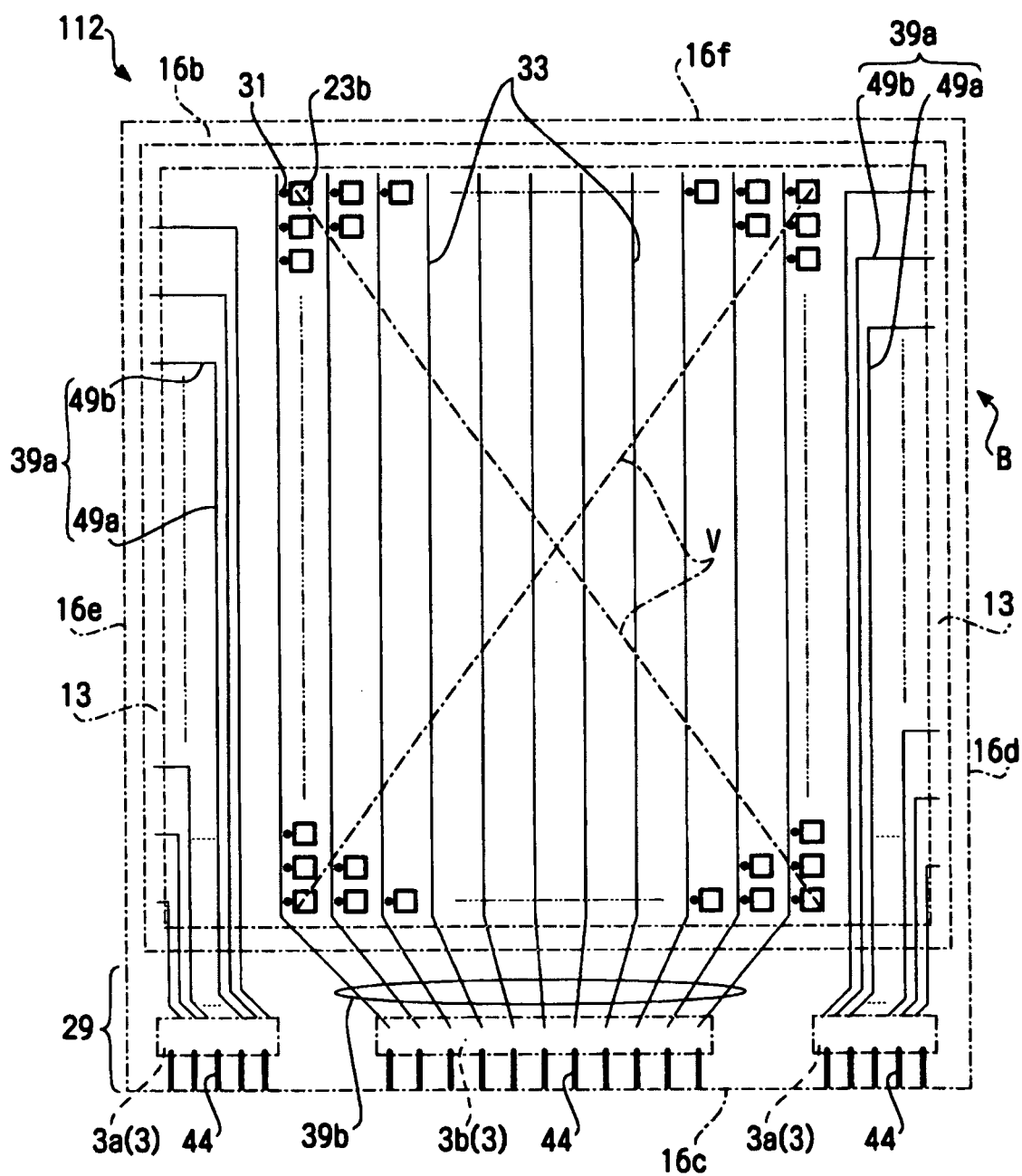
FIG. 15 is a perspective view illustrating a device substrate that is a main portion of an electro-optical device shown in FIG. 14.

Second Embodiment of an Electro-Optical Device Substrate, and the Electro-Optical Device Hereinafter, another embodiment of the electro-optical device according to the present invention will be described. The embodiment is intended to apply the present invention to a liquid crystal device that is an example of the electro-optical device. FIG. 14 illustrates a plan structure of a liquid crystal device 101 being an embodiment of the present invention. FIG. 15 illustrates a plan structure of a device substrate 112 used in the liquid crystal device 101 of FIG. 14. The configuration of the counter substrate 111 opposing the device substrate 112 is basically the same as that of the embodiment shown in FIG. 8, but the front end configuration of the linear electrode 23a is rather different, as described below. In addition, in FIGS. 14 and 15, since the members identical to those in the embodiment shown in FIG. 6 use similar reference numerals, explanation thereof will be omitted.

As apparent from FIG. 14, in the liquid crystal device 101, a plurality of entire wirings 39a disposed on the device substrate 112 is accommodated in a region surrounded by the sealing member 13. In addition, the front end of the electrode wirings 25 extended from the linear electrode 23a disposed on the color filter substrate 111 being the counter substrate is electrically connected to a front end of the wirings 39a at the device substrate 112, in other words, the front end of the bent portion 49b by the conductive material 42 included in the sealing member 13.

Figure 16:
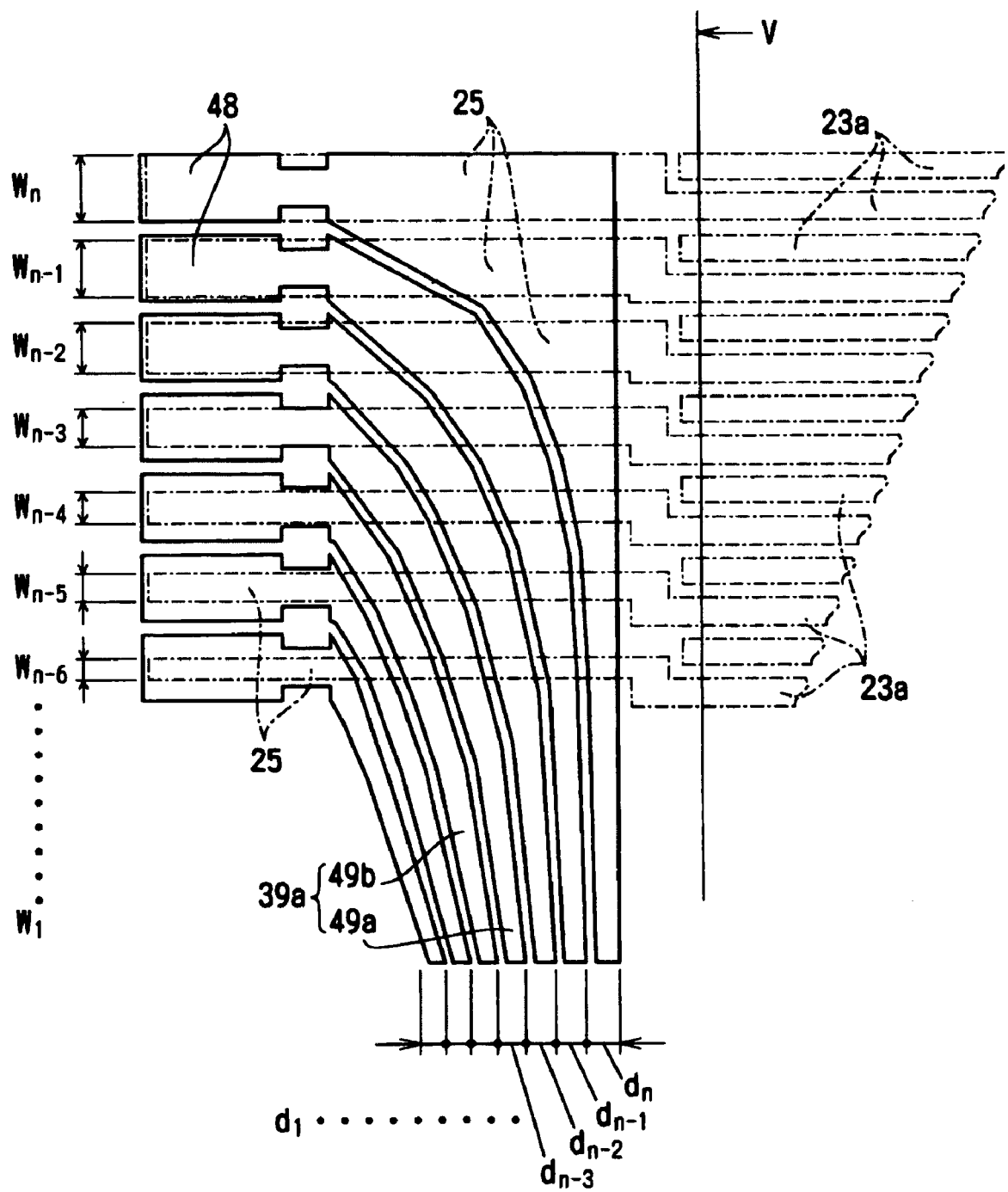
FIG. 16 is an enlarged plan view for a portion indicated by the arrow C of FIG. 14.
Figure 17:
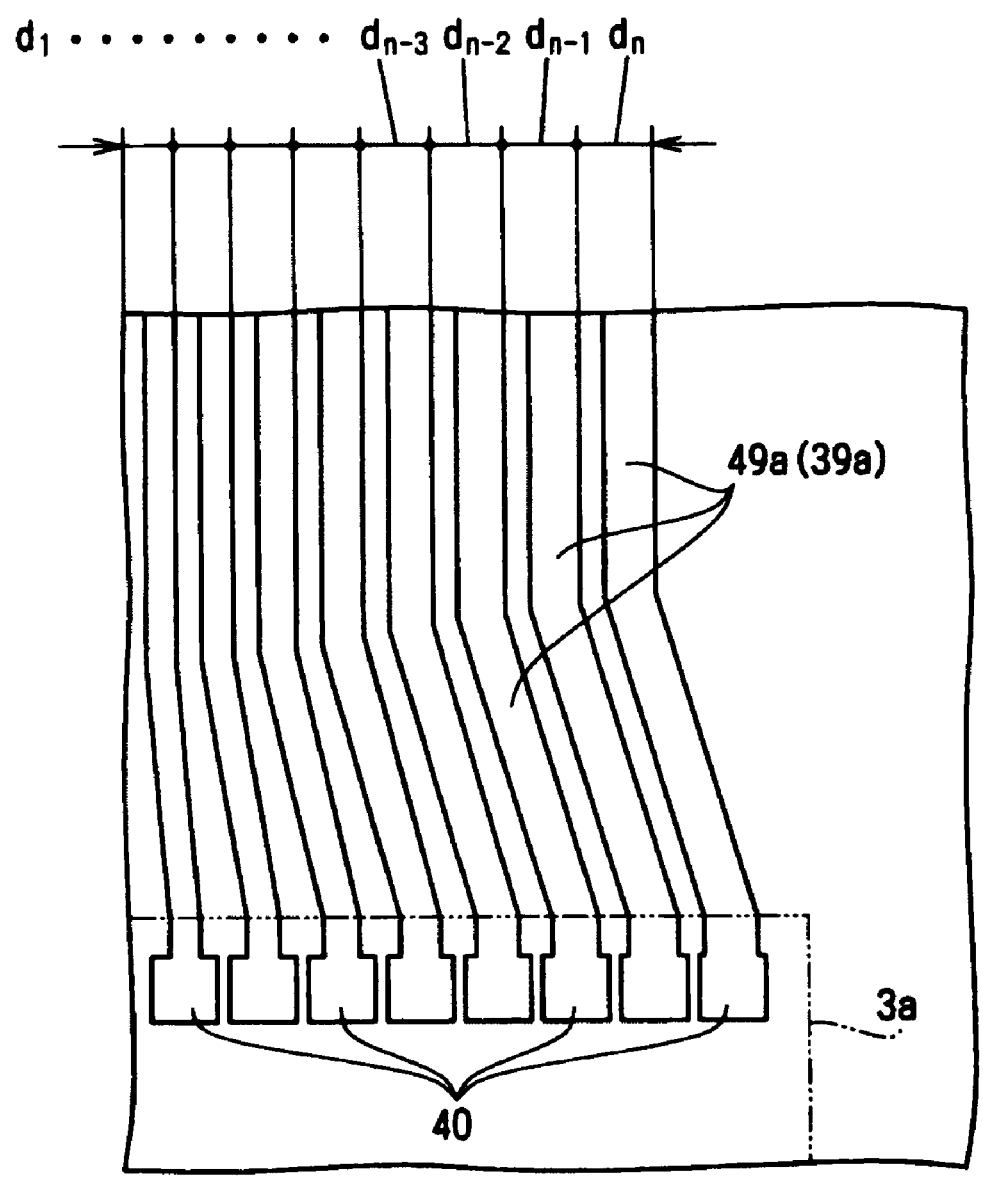
FIG. 17 is an enlarged plan view for a portion indicated by the arrow D of FIG. 14.

FIG. 16 is an enlarged view of a region indicated by arrow C of FIG. 14. As seen from FIG. 16, the electrode wirings 25 are wirings that are extended from the linear electrode 23a to an outer side of the display region V. FIG. 17 is an enlarged view of a region of arrow D of FIG. 14. That is, FIG. 17 illustrates a structure of another end of the wiring structure shown in FIG. 16. As shown in FIG. 17, terminals 40 are formed in respective other ends of the plurality of wirings 39a, and these terminals 40 are connected to an output bump (not shown) of the driver IC 3a by ACF (Anisotropic Conductive Film) or other conductive connection members.

In the present embodiment, as in the embodiment shown in FIG. 9, the wiring width increases in the bent portion 49b of the wirings 39a as shown in FIG. 16. In addition, in the increasingly widened region, an area of the wirings increases as the length of the wirings increases. Accordingly, uniformity of the wiring resistance among the plurality of wirings 39a is realized by preventing high resistance of the long wiring.

In addition, in the present embodiment, as the length of the wirings 39a from the first side 16c to the second side 16f in FIG. 15 is getting longer, the wiring width of the entire wirings 39a is getting larger. Specifically, when viewing the plurality of wirings 39a formed on the left side 16e in FIG. 15, the wirings 39a have the shortest length at the left and the longest length at the right. In FIGS. 16 and 17, assuming that the line width of a leftmost wire line 39a is d1 and the line width of a rightmost wiring line 39a is dn (wherein, n is the line number of the wiring line 39a), the following is set:

$$d1 \leq d2 \leq d3 \leq \ldots \leq dn-1 \leq dn.$$

This configuration is the same for a plurality of wirings 39a formed on the right side 16d of FIG. 15. Thus, for the entire region of the plurality of wirings 39a in the longitudinal direction, since the wiring width is varied in response to the wiring length, the wiring resistance among the plurality of wirings 39a can become more uniform.

In the present embodiment, a plurality of linear electrodes 23a is formed in the stripe shape on the counter substrate 11 shown in FIG. 14. As shown in FIG. 16, the electrode wirings 25 are extended from the electrodes 23a. These electrode wirings 25 are electrically connected to front ends of the plurality of wirings 39a on the device substrate, in other words, the pad 48 by a conductive material 42 distributed in the sealing member 13 of FIG. 14, respectively.

In addition, the plurality of electrode wirings 25 is formed to increase in respective widths W1, W2, W3, ..., Wn−2, Wn−1 and Wn (wherein, n is the number of the wirings 39a), as the wirings 39a increase in length. Accordingly, in FIG. 14, it is possible to make the entire wiring resistance of the wirings 39a from the driver IC 3a to the linear electrode 23a and the electrode wirings 25 uniform among the plurality of electrodes 23a.

However, considering a region indicated by arrow E in FIG. 14, the wirings 39a in this region are very short in length and low in resistance. There is a limitation in raising the resistance value. Accordingly, if only the line width of the wirings 39a of the device substrate is adjusted, the wiring resistance decreases and is not uniform in a region having a short length of wirings, in other words, a region having a small value in the wiring width direction X, as represented by a reference numeral F in FIG. 18. In order to overcome this phenomenon, in the present embodiment, in a wiring width region of FIG. 18 that would have a low wiring resistance, in other words, in a region whose a wiring width is 0 to 40 μm, the line width (corresponding to W1 to Wn of FIG. 16) of the electrode wirings 25 at the counter substrate is thinned to raise a resistance value, and this results in the wiring resistance being set to be uniform for all wirings 39a, as indicated by the reference numeral G. Accordingly, a clear display having no irregularity can be obtained.

OTHER EMBODIMENTS

As described above, the present invention has been described by the preferred embodiments, but is not limited to the embodiments, and may be modified in various manners within the scope of the present invention defined in the claims.

First Embodiment

The following three types of liquid crystal devices were prepared.

A liquid crystal device in which the line widths of all wirings 39a are uniform regardless of the length of the wirings 39a in the liquid crystal device 1 of FIG. 6 (hereinafter, referred to as a conventional product).

A liquid crystal device in which the line widths of the plurality of wirings 39a are uniform in a main line portion 49a and increase in the bent portion 49b, as shown in FIG. 9, in the liquid crystal device 1 of FIG. 6 (hereinafter, referred to as a product according to invention A).

A liquid crystal device in which (a) the line width of the plurality of wirings 39a increases to the bent portion 49b, as shown in FIG. 16, (b) as the length of the wirings 39a increase, the entire wiring width dn of the wirings 39a including the main line portion increases, as shown in FIGS. 16 and 17, and (c) for the wirings 39a having a short length in a region indicated by arrow E of FIG. 14, the width of the wiring electrode 25 at the counter substrate is not adjusted to be small in the liquid crystal device 101 of FIG. 14 (hereinafter, referred to as a product of invention B).

Figure 19A:
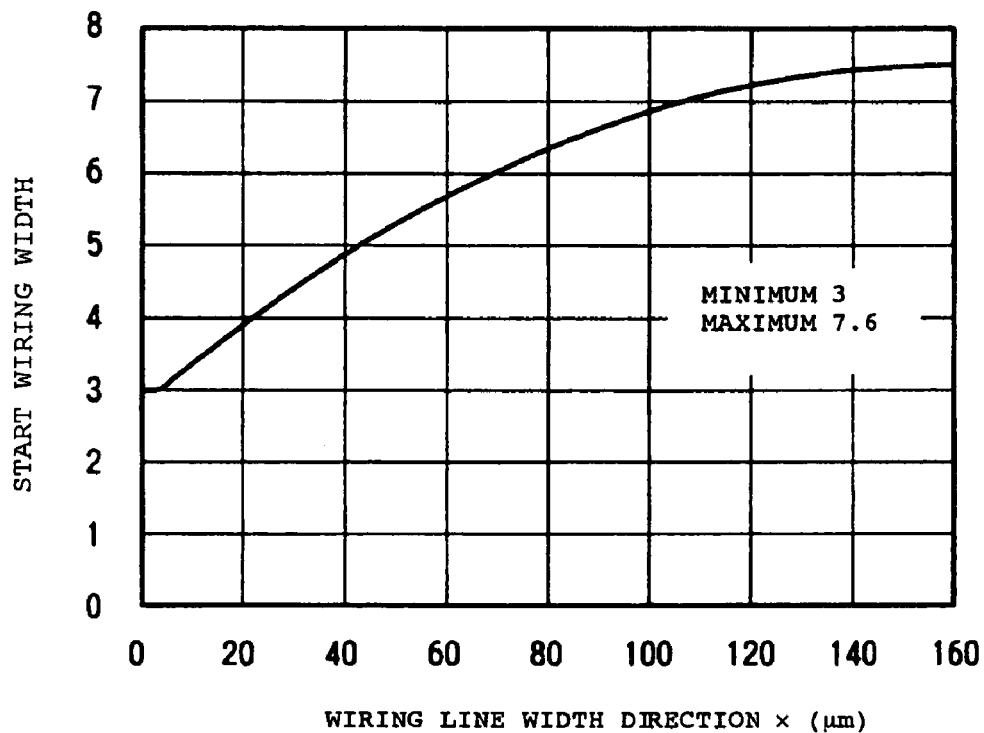
FIG. 19 is a graph illustrating an experiment result.

In addition, the wiring width adjustment in (b) was performed as shown in FIG. 19(a). Specifically, a small side of the wiring width direction X (i.e., a short side in the wiring length) is set to a minimum width "3 μm", and the wiring width increases to a maximum "7.6 μm".

Figure 19B:
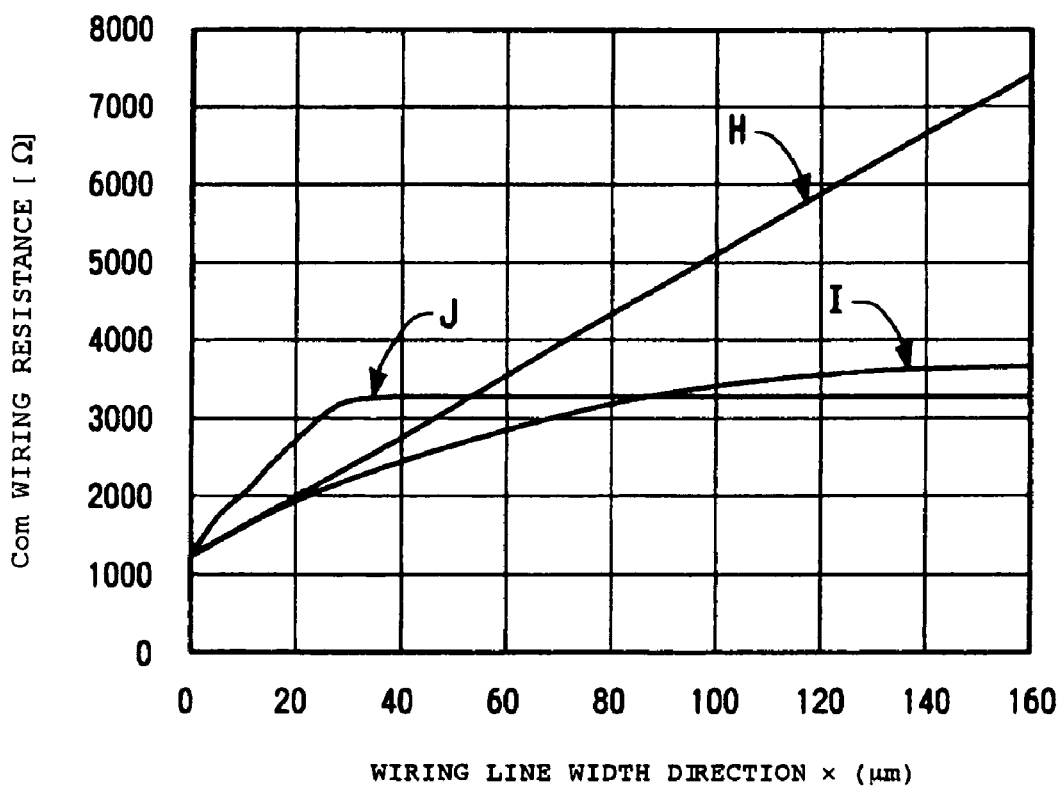

The wiring resistance from the driver IC 3a to the linear electrode 23a in FIGS. 6 and 14 was measured for the three types of the liquid crystal devices. As a result, a result shown in FIG. 19(b) could be obtained. In FIG. 19(b), a reference numeral H denotes the wiring resistance of the conventional product, a reference numeral I denotes the wiring resistance of the product according to invention A, and a reference numeral J denotes the wiring resistance of the product according to invention B. As seen from FIG. 19(b), slowly increasing the line width of the wirings 39a (property I) allows considerable uniformity of the wiring resistance.

In addition, slowly increasing the line width of the wirings 39a and at the same time, changing the entire line width of the wirings 39a depending on the wiring length (property J) allows further uniformity of the wiring resistance.

Figure 18:
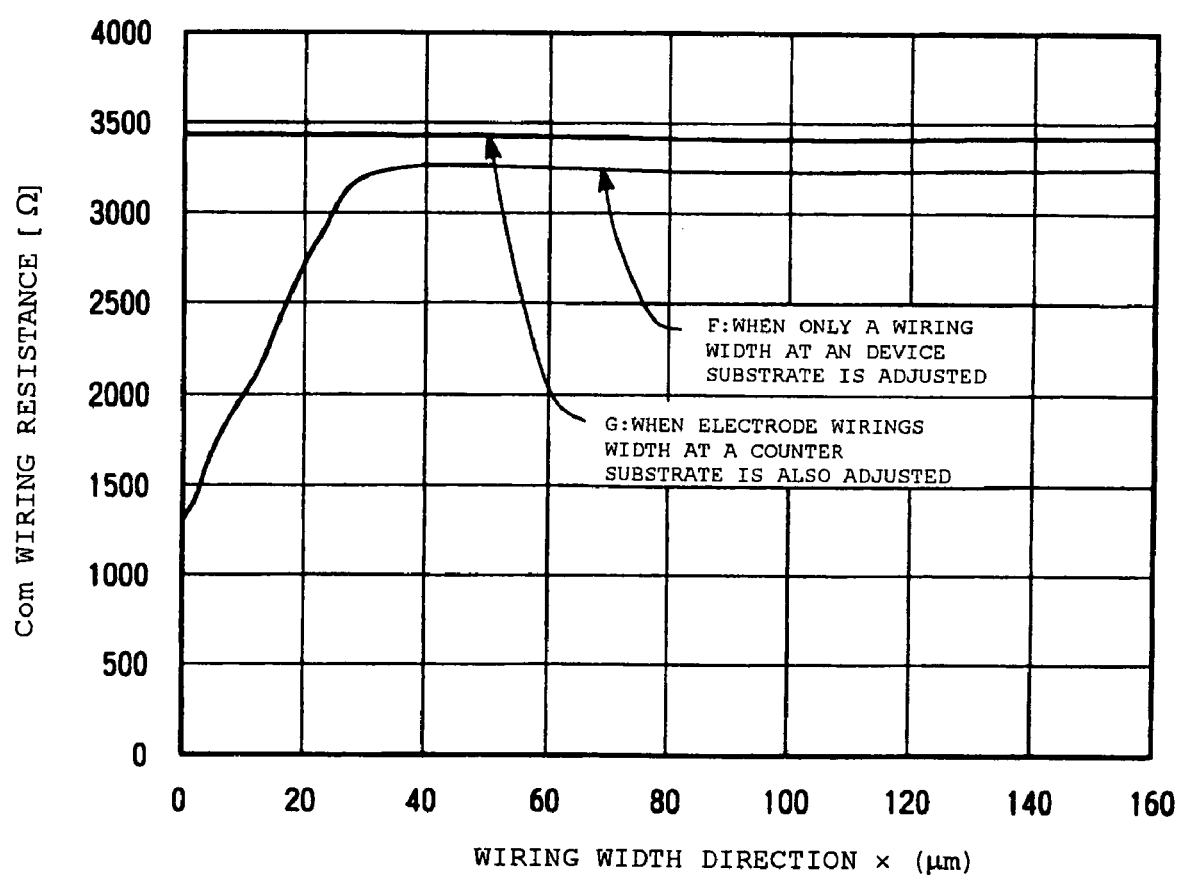
FIG. 18 is a graph illustrating data for determining the line width of electrode wirings in a portion indicated by the arrow E of FIG. 14.

In addition, in the property J of FIG. 19(b), with respect to a region having lower wiring resistance that may be placed at the small side of a wiring width direction X, it is possible to make the wiring resistance more uniform by thinning the line width of the electrode wirings 25 of the counter substrate, as described in connection with FIG. 18.

INDUSTRIAL APPLICABILITY

An electro-optical device substrate according to the present invention is very suitable for use as a substrate for a liquid crystal device, an organic EL device or the like. In addition, the electro-optical device according to the present invention is very suitable for use upon uniform display without irregularities in the liquid crystal device, the organic EL device or the like. Further, an electronic apparatus according to the present invention is very suitable for use upon the uniform display without irregularities on a cellular phone, a portable information terminal, PDA or the like.

What is claimed is:

1. An electro-optical device substrate, comprising:
   a base with a first side and a second side opposite from each other, and
   a plurality of wirings formed on the base,
   wherein at least one of the wirings has a portion whose width gradually increases from the first side of the base to the second side of the base, each of the plurality of wirings having a bent portion with a width that is greater than at a portion other than the bent portion.

2. The electro-optical device substrate according to claim 1,
   wherein the line width of at least one of the wirings increases continuously and gradually.

3. The electro-optical device substrate according to claim 1,
   wherein among the plurality of wirings extending from the first side to the second side, the line width is greater for wirings extending nearer the second side.

4. The electro-optical device substrate according to claim 1,
   wherein gaps among the plurality of wirings are nearly uniform for all of the wirings.

5. The electro-optical device substrate according to claim 1,
   wherein the plurality of wirings further comprises extended wirings for transmitting signals to electrodes.

6. The electro-optical device substrate according to claim 1,
   wherein the plurality of wirings has conductive pads, and the conductive pads are conducted to electrodes on another substrate by a conductive material.

7. The electro-optical device substrate according to claim 1,
   wherein the wirings are formed of one of the following: elemental chromium (Cr); a lamination of two layers, chromium (Cr) and tantalum (Ta); and a lamination of three layers, ITO, chromium (Cr), and tantalum (Ta).

8. An electro-optical device, comprising the electro-optical device substrate according to claim 1 and an electro-optical material layer disposed on the electro-optical device substrate.

9. The electro-optical device according to claim 8, wherein one side of the electro-optical device substrate is a side to which a wiring substrate is connected, and
wherein the plurality of wirings is disposed in a region near edges of two sides adjacent to the one side and also is extended along each of the edges.

10. The electro-optical device according to claim 8, further comprising a counter substrate opposing the electro-optical device substrate,
wherein the wirings are connected to electrodes disposed on the counter substrate by a conductive material.

11. The electro-optical device according to claim 10, wherein the electro-optical material is a liquid crystal.

12. The electro-optical device according to claim 10, wherein the counter substrate has a plurality of electrodes and electrode wirings connected to the plurality of electrodes,
wherein the plurality of electrode wirings is connected to the respective plurality of wirings on the electro-optical device substrate by the conductive material, and
wherein a width of each of the plurality of electrode wirings increases as the length of a corresponding wire line on the electro-optical device substrate increases.

13. The electro-optical device according to claim 12, wherein the electrode wirings on the counter substrate corresponding to the wirings having a short length have a short line width, so that the wiring resistances are uniform between wirings having a long length and wirings having a short length among the plurality of wirings on the electro-optical device substrate.

14. An electronic apparatus, comprising the electro-optical device according to claim 8 and control means for controlling the operation of the electro-optical device.

15. The electro-optical device substrate according to claim 1,
wherein as the length of the plurality of wirings from the first side to the second side increases, the wiring width of the entire region thereof increases.

16. An electro-optical device, comprising:
a substrate having a first edge and a second edge opposite from each other;
a plurality of wirings formed over the base, each of the wirings having a straight portion and a bent portion continuous with each other, the straight portions extending in a direction following a first edge of the substrate and the bent portions extending in a direction that intersects the first edge, the bent portions having a width that is greater than the straight portion and that increases with increasing proximity to one of the first edge.

17. An electro-optical device according to claim 16, wherein one wiring of the wirings is disposed nearer the second edge of the substrate than the other wirings, the one wiring having a bent portion with a right-angled corner.

18. An electro-optical device according to claim 16, wherein wirings with a straight portion farther from the first edge of the substrate have a bent portion with a wider width than wirings with a straight portion closer to the first edge.

* * * * *